(12) United States Patent
Oiso

(10) Patent No.: US 7,188,288 B2
(45) Date of Patent: Mar. 6, 2007

(54) SEMICONDUCTOR LSI CIRCUIT WITH SCAN CIRCUIT, SCAN CIRCUIT SYSTEM, SCANNING TEST SYSTEM AND METHOD

(75) Inventor: Masaki Oiso, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 10/981,986

(22) Filed: Nov. 5, 2004

(65) Prior Publication Data

US 2005/0160336 A1    Jul. 21, 2005

(30) Foreign Application Priority Data

Nov. 12, 2003 (JP) ............................ P2003-382554

(51) Int. Cl.
*G01R 31/28* (2006.01)
(52) U.S. Cl. ..................................... 714/729
(58) Field of Classification Search ................. None
See application file for complete search history.

(56) References Cited

U.S. PATENT DOCUMENTS

| 6,453,436 | B1 | 9/2002 | Rizzolo et al. | |
| 2002/0184582 | A1* | 12/2002 | Pouya et al. ................ | 714/726 |
| 2003/0115522 | A1* | 6/2003 | Nadeau-Dostie et al. ... | 714/726 |
| 2003/0149925 | A1* | 8/2003 | Angelotti et al. ........... | 714/726 |

FOREIGN PATENT DOCUMENTS

| JP | 02-136936 | 5/1990 |
| JP | 06-230075 | 8/1994 |
| JP | 07-092230 | 4/1995 |
| JP | 09-159726 | 6/1997 |
| JP | 10-031056 | 2/1998 |
| JP | 11-108999 | 4/1999 |
| JP | 11-211797 | 8/1999 |
| JP | 2000-230965 | 8/2000 |
| JP | 2000-258498 | 9/2000 |
| JP | 2003-150658 | 5/2003 |

OTHER PUBLICATIONS

Official Action issued on May 23, 2006 (Japanese and English translations) regarding the counterpart Japanese Patent Application No. 2003-382554.

* cited by examiner

*Primary Examiner*—Christine T. Tu
(74) *Attorney, Agent, or Firm*—DLA Piper US LLP

(57) ABSTRACT

A semiconductor LSI circuit provided with a scan circuit includes: to-be-tested combinational logic circuits; scan circuits adjacent to and disposed alternately with the combinational logic circuits; scan elements, which form the scan circuits; a first selector inserted in a first scan circuit scan and connects a first group of scan elements and a second group of scan elements; a second selector inserted in a second scan circuits and connects a third group of scan elements and a fourth group of scan elements; a first route provided in the first group of scan elements and extending from a scanning output terminal of a scan element; and a second route provided in a third group of scan elements and extending from the scanning output terminal of a scan element. The first selector selects either the first route or the second route.

18 Claims, 26 Drawing Sheets

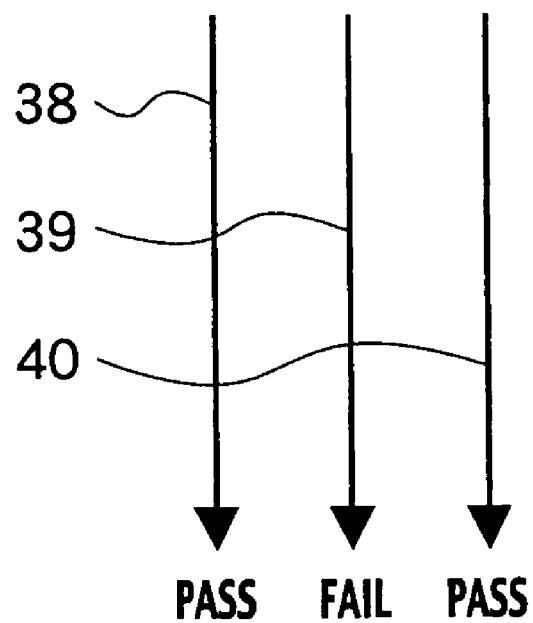
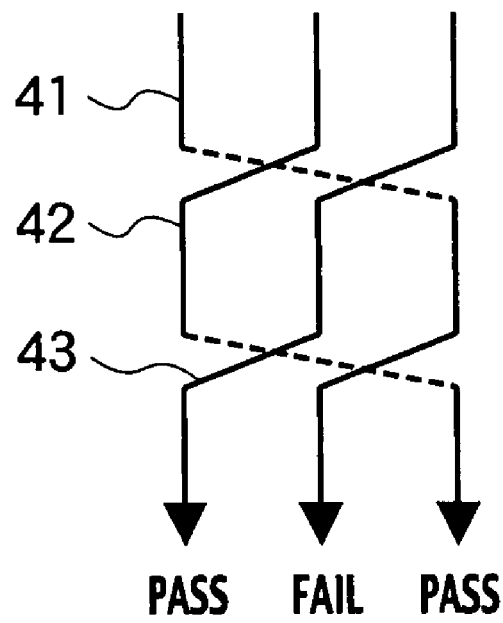
FIG. 4A
FIG. 4B

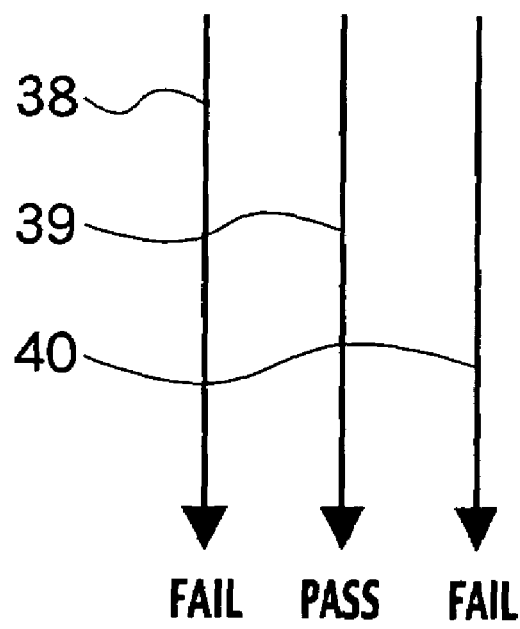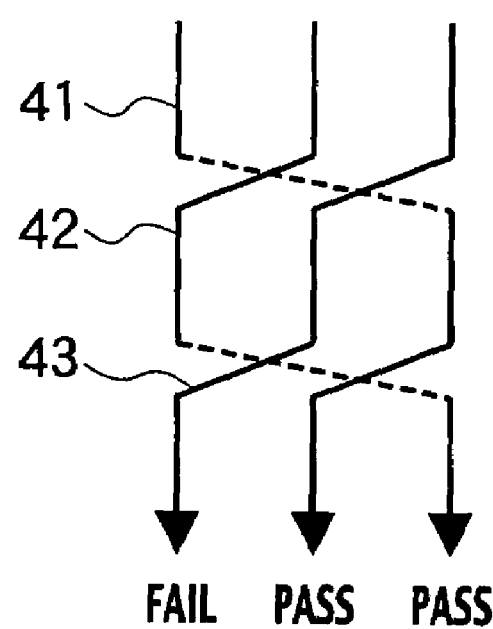

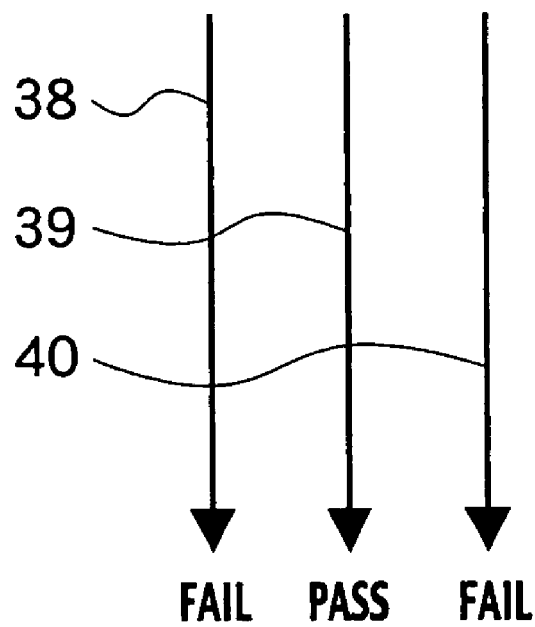 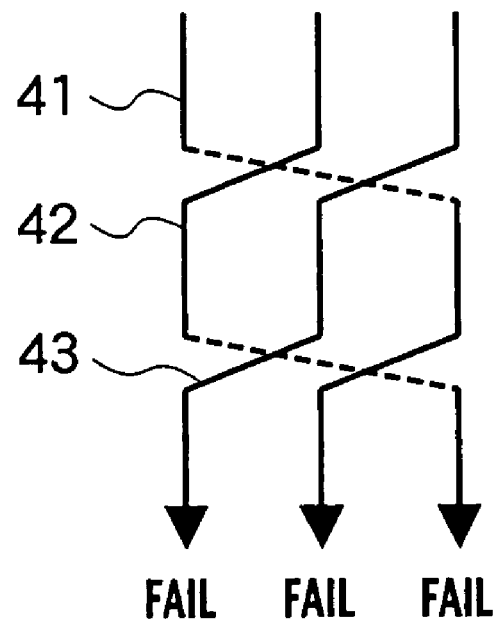

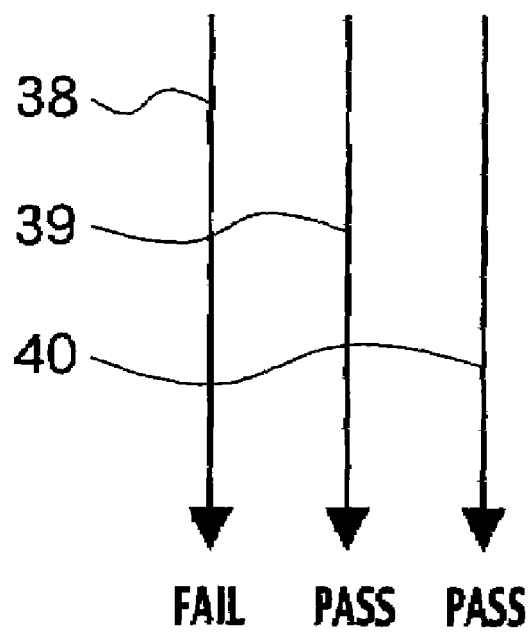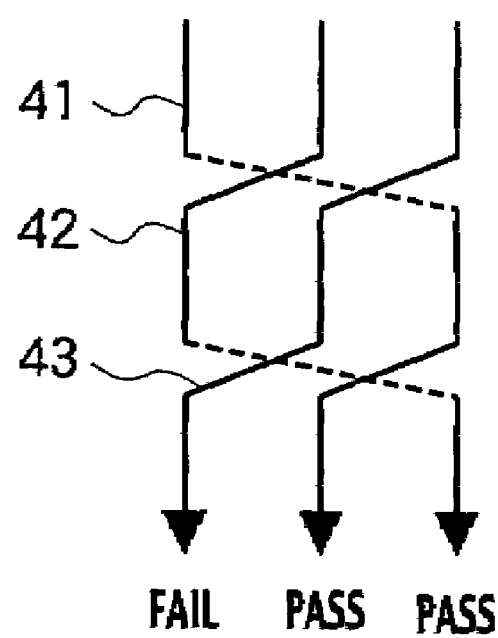

SEMICONDUCTOR LSI CIRCUIT WITH SCAN CIRCUIT, SCAN CIRCUIT SYSTEM, SCANNING TEST SYSTEM AND METHOD

CROSS REFERENCE TO RELATED APPLICATIONS

This application is based upon and claims the benefit of priority from prior Japanese Patent Applications P2003-382554 filed on Nov. 12, 2003; the entire contents of which are incorporated by reference herein.

BACKGROUND OF THE INVENTION

1. Field of the Invention

The present invention relates to a semiconductor LSI circuit design for testing a circuit. In particular, the invention relates to a semiconductor LSI circuit including scan circuits, a scan circuit system, and a scanning test system, which are applied to circuit design for a scan circuit shifting test.

2. Description of the Related Art

Generation of test patterns for testing complex semiconductor LSI circuits requires a significant part of the time needed for designing an LSI. A combination of test patterns generated for a designed function test that allows a high fault detection rate may be selected and used for a fabrication test. However, there is a problem that the quality of the selected test patterns or the fault detection rate for the fabrication test is often insufficient. Test patterns for testing functions are generated on the basis of each function being executed correctly within the design margin, but the test patterns are not generated on the basis of whether failures in circuits can be detected. In addition, since a complex LSI circuit requires an enormous amount of time to carry out a fault simulation for calculating a fault detection rate, failures are sampled for the fault simulation, or patterns are selected in conformity with the activation rate of each signal calculated through a logic simulation. In those cases, the fault detection rate cannot be calculated accurately.

A design for testability (DFT) is a technology for enhancing testing by embedding the smallest possible test circuits in LSI circuits to optimize the test pattern generation period, the test pattern size, testing time, and the ultimate fault detection rate. Typically, the design for testability includes scanning design, a memory built-in self test (BIST), and logic BIST.

The scanning design is a DFT technology, which has been widely used. All registers (flip-flops (F/Fs) or latches) within sequence circuits are replaced with dedicated registers called 'scan registers', which are one or more shift registers (forming a scan path) and serially connected to each other. Usage of this structure allows direct control and monitoring of registers of an internal circuit, which is usually difficult, via external input/output terminals. This allows considerable simplification in test pattern generation processing. In particular, test patterns with high fault detection rates can be generated in a short period using an automatic test pattern generation (ATPG) program.

A test circuit that uses all F/Fs except for faulty F/Fs, and prevents misjudgment of whether an LSI circuit has a failure and reduces the scan path read-out/write-in time has been disclosed (Patent Reference 1: Japanese Patent Laid-Open No. Hei 4-250371). In addition, a semiconductor LSI circuit that controls scan paths or the like and monitors test patterns even if there are some failures on a scan path has been disclosed (Patent Reference 2: Japanese Patent Laid-Open No. Hei 10-31056).

The conventional scanning design provides a plurality of individual scan paths. In a scan circuit shifting test, all memory elements belonging to those scan paths in a semiconductor LSI circuit with a conventional scan circuit are targets of failure analysis. In this case, when there are several thousands of memory devices, all of the devices are targets of failure analysis, which makes failure analysis a very difficult problem. In other words, according to the prior art, when an error is detected through a scanning and shifting test, all scan paths have been subjected to failure analysis.

In addition, according to the conventional scanning design, since circuits are generated without regard to the clock-tree structure, an element at the end of a clock tree or an upper driver therein is controlled first. For example, assume that a faulty scan element is connected to a faulty clock driver. In this case, when the clock tree has a failure, errors are found in all scan paths, which makes failure analysis difficult. Therefore, when a clock driver has a failure, errors are found in all scan paths including a scan element connected to that faulty clock driver failure analysis is very difficult.

Furthermore, a set signal and a reset signal have the same problem as in the clock tree. In other words, according to the prior art, when a structure relevant to a set signal or a reset signal has a failure, errors are found in all scan paths including a scan element connected thereto, and failure analysis is very difficult.

SUMMARY OF THE INVENTION

A first aspect of the present invention inheres in a semiconductor LSI circuit provided with a scan circuit that includes a plurality of to-be-tested combinational logic circuits; a plurality of scan circuits adjacent to and disposed alternately with the combinational logic circuits; a plurality of scan elements, which form the scan circuits; a first selector inserted in a first scan circuit of the plurality of scan circuits and connects a first group of scan elements and a second group of scan elements in the scan circuits; a second selector inserted in a second scan circuit of the plurality of scan circuits and connects a third group of scan elements and a fourth group of scan elements in the scan circuits; a first route provided in the first group of scan elements and extending from a scanning output terminal of a scan element prior to the first selector to the first selector; and a second route provided in a third group of scan elements and extending from the scanning output terminal of a scan element prior to the second selector to the first selector, wherein the first selector selects either the first route or the second route and the combinational logic circuits include a buffer, an inverter, a NAND gate, an AND gate, a NOR gate, an OR gate, or an exclusive OR gate.

A second aspect of the present invention inheres in a scan circuit system that includes a semiconductor LSI circuit provided with a scan circuit; which includes a plurality of to-be-tested combinational logic circuits, a plurality of scan circuits adjacent to and disposed alternately with the combinational logic circuits, a plurality of scan elements, which form the scan circuits, a first selector inserted in a first scan circuit of the plurality of scan circuits and connecting a first group of scan elements and a second group of scan elements in the scan circuits, a second selector inserted in a second scan circuit of the plurality of scan circuits and connecting a third group of scan elements and a fourth group of scan elements in the scan circuits, a first route provided in the first group of scan elements and extending from a scanning output terminal of a scan element prior to the first selector to the first selector, and a second route, which is disposed in the third group of scan elements and extending from the scanning output terminal of a scan element prior to the second selector to the first selector, wherein the first selector selects either the first route or the second route; input buffers and output buffers connected to the scan path; scan shift input terminals connected to the input buffers; and scan shift output terminals connected to the output buffers, wherein the combinational logic circuits include a buffer, an inverter, a NAND gate, an AND gate, a NOR gate, an OR gate, or an exclusive OR gate.

A third aspect of the present invention inheres in a scanning test system that includes; a scan circuit system including, a semiconductor LSI circuit provided with a scan circuit including a plurality of to-be-tested combinational logic circuits, a plurality of scan circuits adjacent to and disposed alternately with the combinational logic circuits, a plurality of scan elements forming the scan circuits, a first selector inserted in a first scan circuit of the plurality of scan circuits and connecting a first group of scan elements and a second group of scan elements in the scan circuits, a second selector inserted in a second scan circuit of the plurality of scan circuits and connecting a third group of scan elements and a fourth group of scan elements in the scan circuits, a first route disposed in the first group of scan elements and extending from a scanning output terminal of a scan element prior to the first selector to the first selector, and a second route disposed in the third group of scan elements and extending from the scanning output terminal of a scan element prior to the second selector to the first selector, wherein the first selector selects either the first route or the second route, input buffers and output buffers connected to the scan path, scan shift input terminals connected to the input buffers, and scan shift output terminals connected to the output buffers; a tester receives a test pattern generated from the scan circuit system and feeds back the test results to the scan circuit system; and a clock tree, which includes root drivers connected to the scan circuit system, wherein the combinational logic circuits include a buffer, an inverter, a NAND gate, an AND gate, a NOR gate, an OR gate, or an exclusive OR gate.

A fourth aspect of the present invention inheres in a scanning test system method including: testing an LSI by a tester; obtaining diagnostics information from the tester, which is failure data of the LSI; obtaining net list data; comparing the diagnostics information and the net list data, and carrying out failure analysis using a failure analysis tool; and detecting diagnostics information in conformity with the failure analysis results.

BRIEF DESCRIPTION OF DRAWINGS

FIG. 4A is a schematic diagram of scanning test paths for the semiconductor LSI circuit with the scan circuits according to the first embodiment of the present invention when a shifting test is carried out several times, and describes a scanning test 1;

FIG. 4B is a schematic diagram of scanning test paths for the semiconductor LSI circuit with the scan circuits according to the first embodiment of the present invention when a shifting test is carried out several times, and describes a scanning test 2;

FIG. 7A is a schematic diagram of scanning test paths for the semiconductor LSI circuit with the scan circuits according to the second embodiment of the present invention when a shifting test is carried out several times, and describes a scanning test 1;

FIG. 7B is a schematic diagram of scanning test paths for the semiconductor LSI circuit with the scan circuits according to the second embodiment of the present invention when a shifting test is carried out several times, and describes a scanning test 2;

FIG. 9A is a schematic diagram of scanning test paths when a scan circuit shifting test is carried out several times in FIG. 8, and describes a scanning test 1;

FIG. 9B is a schematic diagram of scanning test paths when a scan circuit shifting test is carried out several times in FIG. 8, and describes a scanning test 2;

FIG. 18A is a schematic diagram of scanning test paths for the semiconductor LSI circuit with the scan circuits according to the sixth embodiment of the present invention when a shifting test is carried out several times, and describes a scanning test 1;

FIG. 18B is a schematic diagram of scanning test paths for the semiconductor LSI circuit with the scan circuits according to the sixth embodiment of the present invention when a shifting test is carried out several times, and describes a scanning test 2;

DETAILED DESCRIPTION OF THE INVENTION

Figure 1:
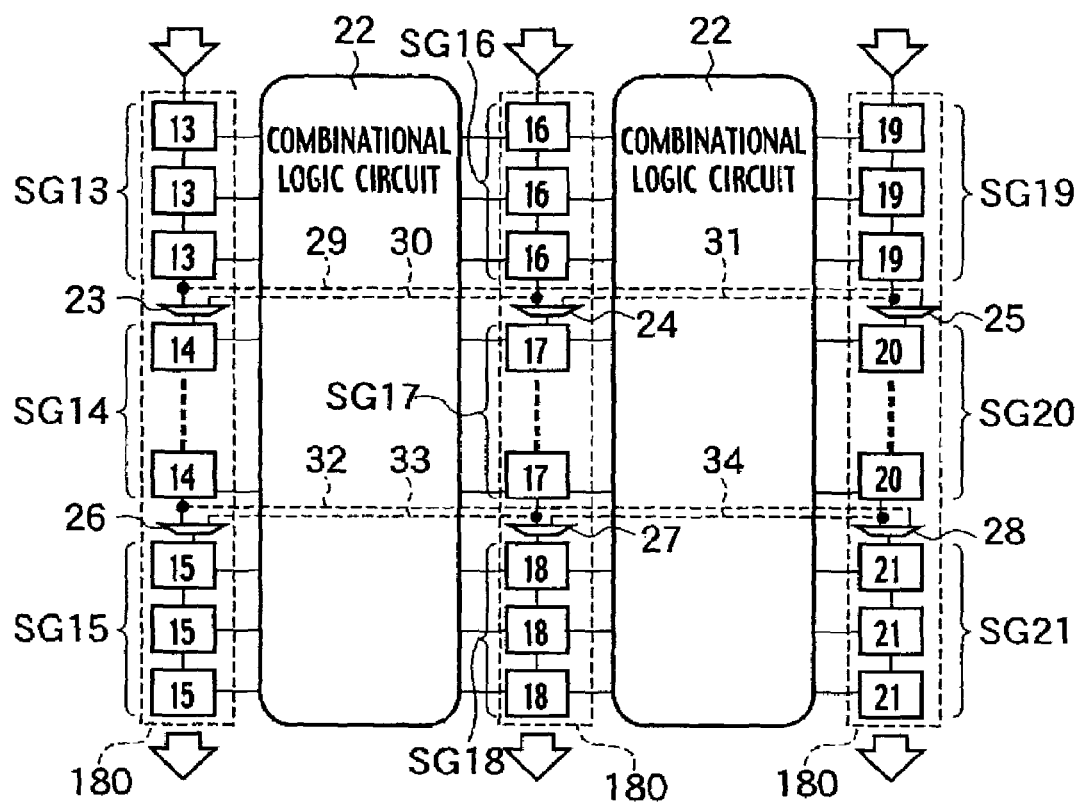
FIG. 1 is a schematic connection diagram of a semiconductor LSI circuit with scan circuits according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order not to obscure the present invention in unnecessary detail.

In addition, the following embodiments exemplify an apparatus and a method for embodying a technical idea of the present invention, and are not intended to limit the technical idea of the present invention to the following. The technical idea of the present invention can be variously modified, while still falling within the appended claims.

In a semiconductor LSI circuit with scan circuits 180 according to the embodiments of the present invention, selectors 23 to 28 are inserted at a midpoint of the scan paths 38 to 40 and 41 to 43 (FIGS. 7A and 7B), respectively, for a shifting test for a scanning test, and a plurality of shifting tests using different routes are carried out to select a plurality of shifting test routes for all to-be-tested targets or all memory elements 13 to 21 on the scan paths 38 to 40 and 41 to 43. In addition, each group of memory elements 48 to 51 (FIG. 14), which are controlled by a driver located at the end of a clock tree 100 or an upper driver therein, are disposed between the selectors 23 to 28 and the subsequent selectors on a route of the scan path. Moreover, to-be-tested memory elements 58, 59, 62, and 63 (FIG. 16), which are controlled by a set or reset signal as with the each group of memory elements 48 to 51, are disposed on the same route of the scan path. Furthermore, a scanning test system and a scanning test method are provided, which identify failure portions using the obtained diagnostics information by a scan circuit system 200 including a semiconductor LSI circuit with the scan circuits 180 or a semiconductor LSI circuit with the scan circuits.

A semiconductor LSI circuit with scan circuits according to the embodiments of the present invention allows analysis of fewer failure analysis targets, resulting in reduction in cost and time for the failure analysis. In addition, automation of the scan processes design time, failure analysis time, and improves failure analysis accuracy. Moreover, a failure in buffers forming a clock tree, or a failure of a set or a reset signal can be narrowed down on a F/F level. Furthermore, failure analysis along a shift path becomes easy.

First Embodiment (Basic Structure of a Semiconductor LSI Circuit with Scan Circuits)

As shown in FIG. 1, a semiconductor LSI circuit with scan circuits according to the first embodiment of the present invention includes a plurality of to-be-tested combinational logic circuits 22; a plurality of scan circuits 180 alternately disposed adjacent to the combinational logic circuits 22; D-type F/Fs 13 to 21, which are a plurality of scan elements forming the scan circuits 180; a first selector 23 inserted in a first scan circuit of the plurality of scan circuits 180 connects a first group of scan elements SG13 and a second group of scan elements SG14 in the scan circuits; a second selector 24 inserted in a second scan circuit of the plurality of scan circuits 180 connects a third group of scan elements SG16 and a fourth group of scan elements SG17 in the scan circuits. A first route is disposed in the first group of scan elements SG13 and extends from the scanning output terminal of a scan element 13 prior to the first selector 23 to the first selector 23. A second route 30 is disposed in the third group of scan elements SG16 and extends from the scanning output terminal of a scan element 16 prior to the second selector 24 to the first selector 23. The first selector selects either the first route or the second route 30. With such configuration, the route of the scan path can be changed by changing the setting of the selector 23. A similar configuration is employed so as to allow the selectors 24 to 28 to select routes. Selection of routes allows testing for a plurality of routes; however, the number of memory elements for a scanning test and the number of scan paths remain unchanged. In other words, in the example of FIG. 1, the number of the D-type F/Fs 13 to 21, which form memory elements for the scanning test, is unchanged, and the number of scan paths remains unchanged at three.

A group of scan elements located between the input terminal of each scan path and the subsequent selector, between a selector and the subsequent selector, or between the selector and the output terminal is referred to as a 'scan segment'. In FIG. 1, each of the D-type F/F groups SG13 to SG21 forms a scan segment.

(Selector)

Figure 2:
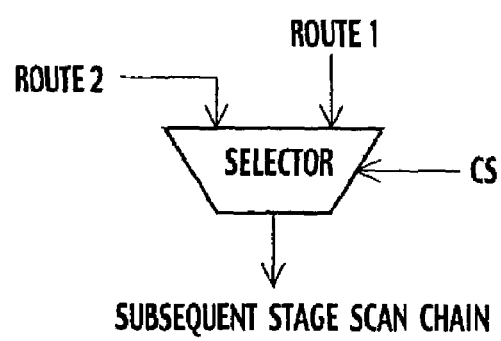
FIG. 2 is an exemplary selector, which is used to select a route for a shifting test for the semiconductor LSI circuit with the scan circuits according to the first embodiment of the present invention.

Each of the selectors 23 to 28 is made up of a multiplexer. As shown in FIG. 2, for example, the selector 23 functions as a switching circuit that switches segment signals from the route 1 and the route 2 in conformity with a control signal CS, and transmits the segment signals to the subsequent scan chain. FIG. 2 shows an example of two routes; alternatively, a route may be selected from a route other than the two routes.

FIG. 4 shows an example where the scan path for a scanning and shifting test is changed by changing the setting for the selectors 23 to 28. The shifting test 1 shown in FIG. 4A proves that the scan path 38 (extending along SG13-SG14-SG15 in FIG. 1), the scan path 39 (extending along SG16-SG17-SG18 in FIG. 1), and the scan path 40 (extending along SG19-SG20-SG21 in FIG. 1) are selected. The shifting test 2 shown in FIG. 4B proves that the scan path 41 (extending along SG13-SG20-SG18 in FIG. 1), the scan path 42 (extending along SG16-SG14-SG21 in FIG. 1), and the scan path 43 (extending along SG19-SG17-SG15 in FIG. 1) are selected.

(Operational Example when a Segment has a Failure)

Figure 3:
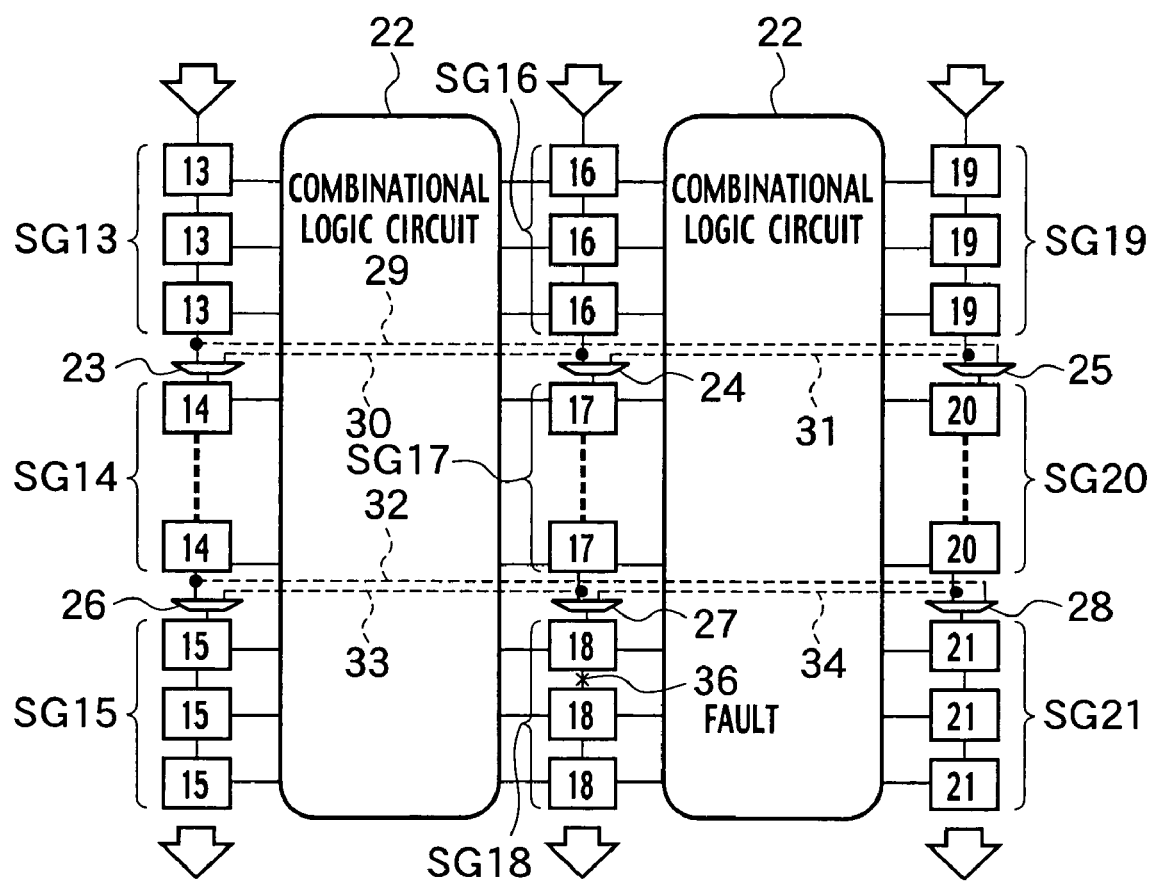
FIG. 3 is a schematic diagram of when shifting connection has a failure found through the shifting test for the semiconductor LSI circuit with the scan circuits according to the first embodiment of the present invention.
Figure 13:
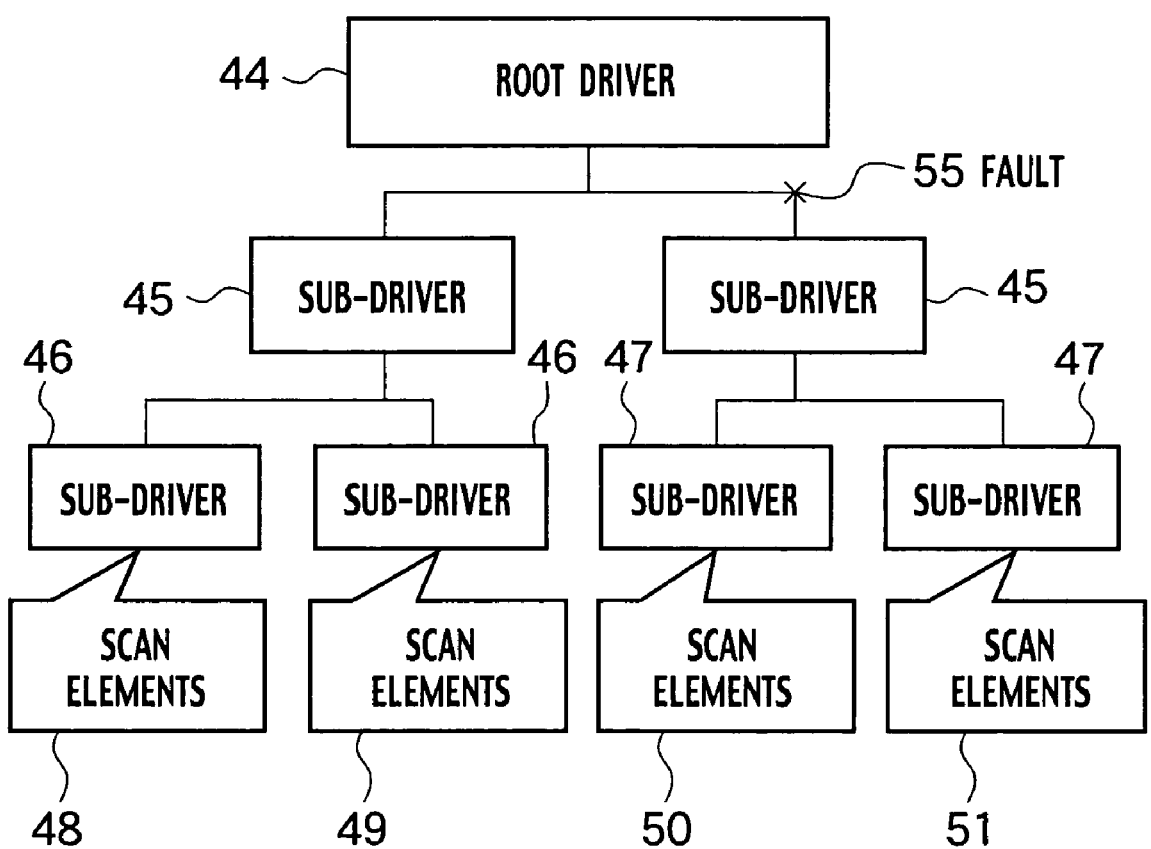
FIG. 13 is a schematic diagram of a clock tree structure in which an upper driver has a failure.

FIG. 3 shows a case where the segment SG18 in the semiconductor LSI circuit provided with scan circuits, according to the first embodiment of the present invention shown in FIG. 1, has a fault 36. With the prior art, all D-type F/F groups on the scan path extending along the segments SG16-SG17-SG18 in FIG. 13 are failure analysis targets. On the other hand, as shown in FIGS. 4A and 4B, usage of the scan circuits of the present invention narrows down the failure analysis target to the segment SG18 by carrying out the shifting test twice, i.e., the scanning test 1 and the scanning test 2. The scanning test 1 in FIG. 4A provides the results of 'pass', 'fail', and 'pass' for the scan paths 38 to 40, respectively. On the other hand, the scanning test 2 in FIG. 4B provides the results of 'fail', 'pass', and 'pass' for the scan paths 41 to 43, respectively. Since the scanning test 1 has determined the scan path 39 as 'fail', existence of a failure either in the group of scan elements SG16, SG17, or SG18 is estimated. In addition, since the scanning test 2 has determined the scan path 41 as 'fail', existence of a failure either in the group of scan elements SG13, SG20, or SG18 is estimated. Accordingly, narrowing down the failure analysis target to the segment SG18 according to a combination of two test results in FIGS. 4A and 4B is possible.

With the semiconductor LSI circuit including scan circuits according to the first embodiment of the present invention, the range of target portions with failure can be narrowed down by inserting a switching circuit midpoint of a scan path to provide a plurality of scan path routes, and carrying out a scan circuit shifting test several times.

Second Embodiment

Figure 5:
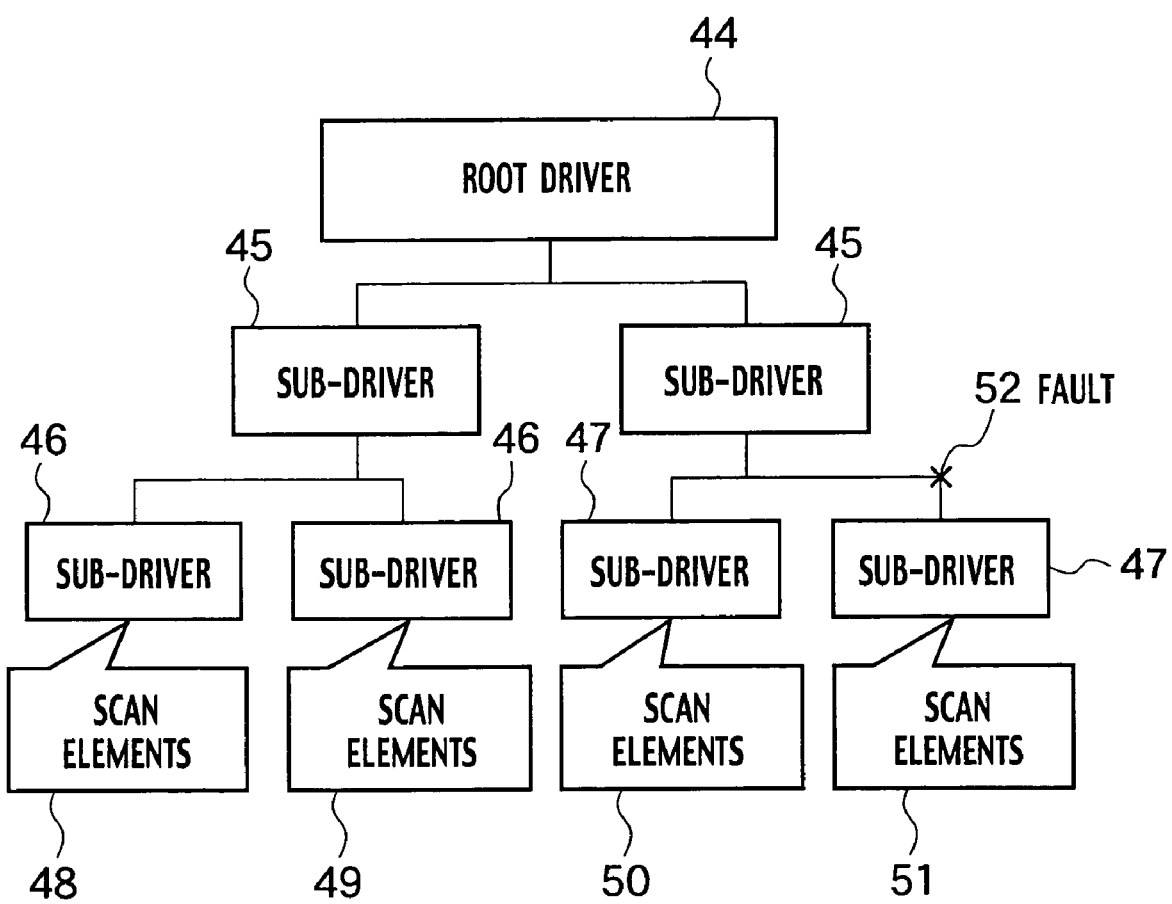
FIG. 5 is a schematic diagram of a clock-tree structure, which is used for a scan circuit according to a second embodiment of the present invention, in the case of a driver at the end of the tree having a failure.
Figure 6:
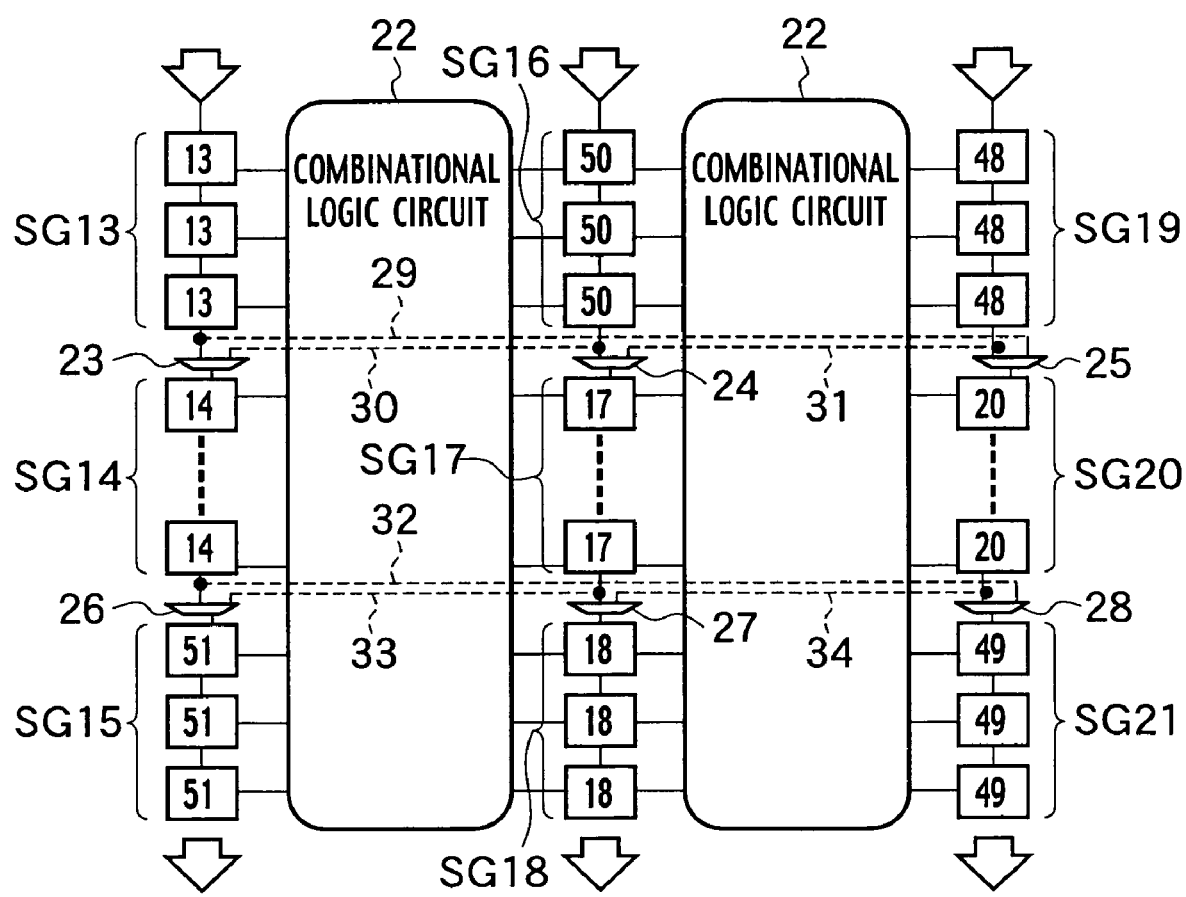
FIG. 6 is a schematic connection diagram of a semiconductor LSI circuit with scan circuits according to the second embodiment of the present invention, and is also a schematic diagram of the case where each group of memory elements being controlled by an element at the end of the clock tree forms a single segment.

A semiconductor LSI circuit with scan circuits according to a second embodiment of the present invention is described using FIGS. 5 through 7. As shown in FIG. 6, the semiconductor LSI circuit with scan circuits has basically the same structure as the first embodiment. As shown in FIG. 5, the clock tree structure is made up of two sub-drivers 45, which branch off from the root driver 44, two sub-drivers 46 and two sub-drivers 47, which branch off from the sub-drivers 45, respectively. The groups of scan elements 48 and 49 are controlled by the respective sub-drivers 46, and the groups of scan elements 50 and 51 are controlled by the respective sub-drivers 47.

In the second embodiment of the present invention, the groups of memory devices, which are controlled by the same root driver or other drivers, are disposed in a single segment SG that forms a scan path. For example, the groups of scan elements 48, 49, 50, and 51 in FIG. 5 are disposed in the segments SG19, SG21, SG16, and SGl5 in FIG. 6, respectively.

Figure 8:
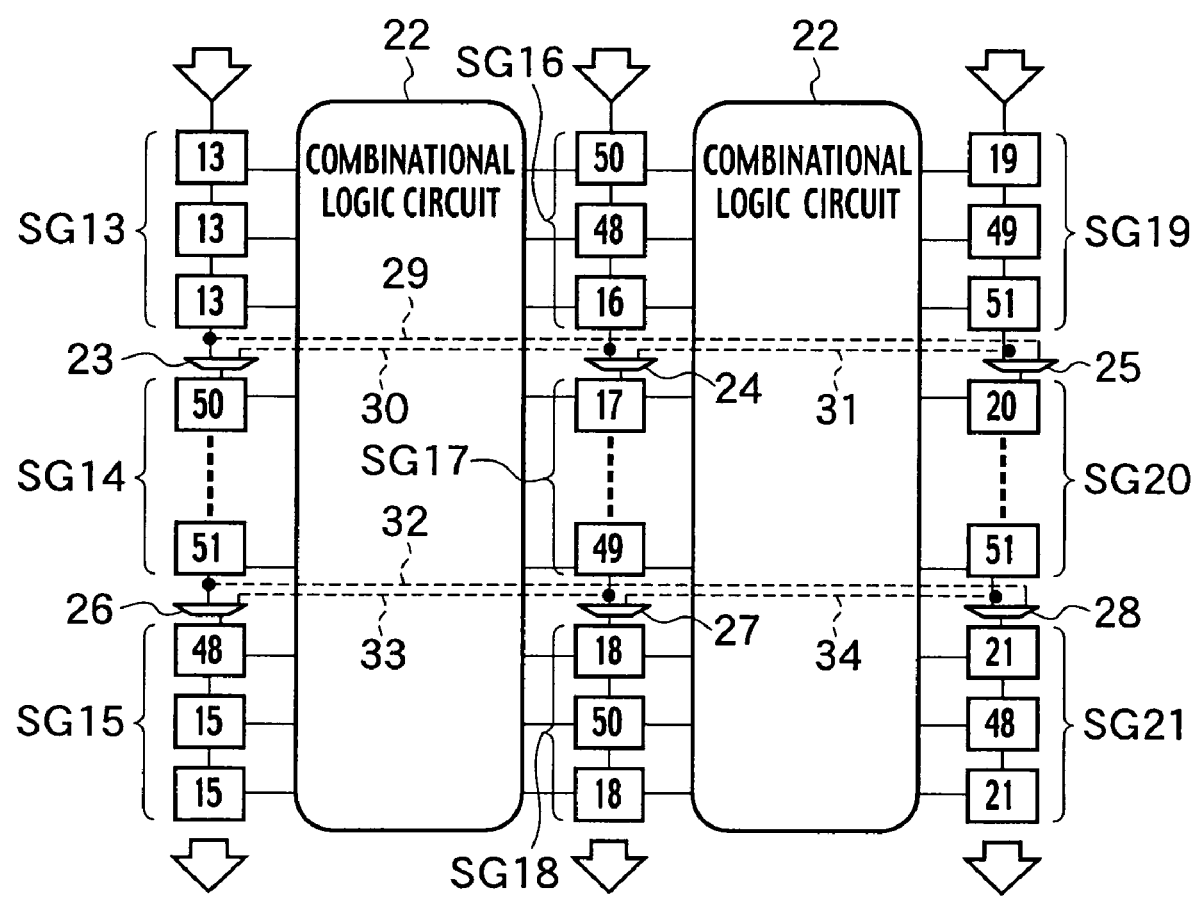
FIG. 8 is a reference diagram of the case where each group of memory elements being controlled by an element at the end of the clock tree forms a plurality of segments in the structure of the semiconductor LSI circuit with the scan circuits according to the second embodiment of the present invention.

The case where the sub-driver 47 has a fault 52 as shown in FIG. 5 will be considered. A schematic diagram of groups of memory devices, which are controlled by an element at the end of the clock tree and disposed in a LSI circuit according to the second embodiment, having a plurality of segments, is shown in FIG. 8 as a reference example for comparison. In addition, FIG. 9 shows a schematic diagram of scanning test paths, as a reference example, when the shifting test for the scan circuit in FIG. 8 is carried out several times. As shown in the reference example in FIG. 8, the group of scan elements 51 is, for example, disposed in the segments SG14, SG19, and SG20. Since groups of memory elements controlled by the same root driver or sub-drivers are disposed to form a plurality of segments, the group of faulty scan elements 51 is detected in the plurality of scan paths even though the scanning tests 1 and 2 are carried out as shown in FIGS. 9A and 9B, resulting in a difficult failure analysis. In other words, in the example of scanning test 1 in FIG. 9A, the results of 'fail', 'pass', and 'fail' are obtained for the scan paths 38 to 40, respectively. In the example of scanning test 2 in FIG. 9B, the results of 'fail', 'fail', and 'fail' are obtained for the scan paths 41 to 43, respectively. As a result, a group of faulty scan elements is detected in the plurality of scan segments, resulting in a difficulty in failure analysis.

In the second embodiment of the present invention, as shown in FIG. 6, the group of memory elements 51 controlled by the sub-driver 47 is disposed to form the segment SG15, even if the sub-driver 47 includes the fault 52 as shown in FIG. 5. Therefore, the failure analysis target can be narrowed down to the scan segment SG15 by carrying out the scanning test twice, i.e., the scanning test 1 and the scanning test 2 as shown in FIGS. 7A and 7B. In other words, the results 'fail', 'pass', and 'pass' are obtained for the scan paths 38 to 40, respectively, through the scanning test 1 in FIG. 7; and the results 'pass', 'pass', and 'fail' are obtained for the scan paths 41 to 43, respectively, through the scanning test 2 in FIG. 7B. Accordingly, narrowing down the failure analysis target to the scan segment SG15 using a combination of the results in FIGS. 7A and 7B is possible.

When a failure is detected in the clock tree, identifying a failure is difficult. In particular, as shown in FIG. 8, if scan paths are formed without regard to the clock-tree structure, and if the clock root driver or the sub-driver has a failure, a plurality of failures may be detected in the numerous scan paths, resulting in difficulty in identification of a failure portion.

With the configuration of the semiconductor LSI circuit including scan circuits according to the second embodiment, clock failure portions found through the shifting test can be easily narrowed down by considering the clock-tree structure and forming scan path segments for each clock sub-driver.

Third Embodiment

Figure 10:
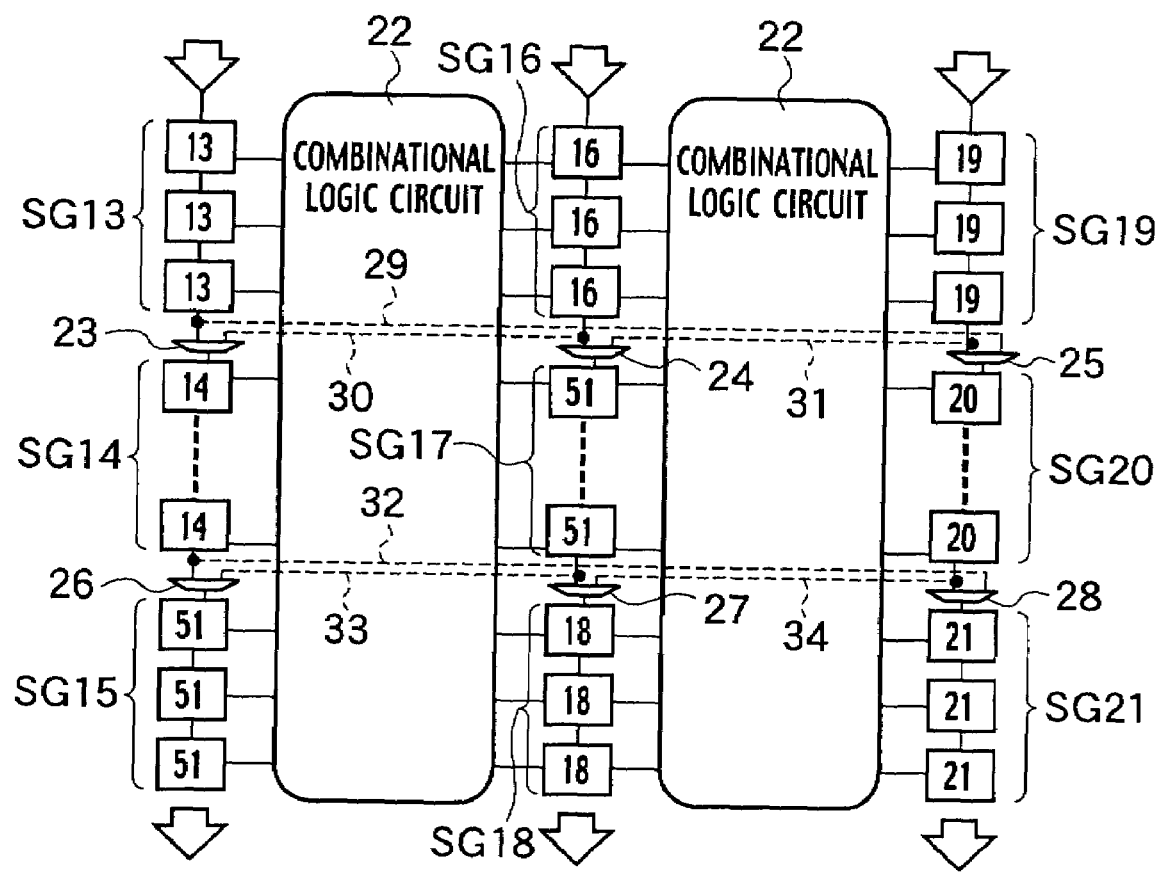
FIG. 10 is a schematic connection diagram of a semiconductor LSI circuit with scan circuits according to a third embodiment of the present invention, and is also a schematic diagram of the case where each group of memory elements being controlled by an element at the end of the clock tree forms a plurality of segments.

A semiconductor LSI circuit including scan circuits according to a third embodiment of the present invention is described using FIGS. 10 and 11. As shown in FIG. 10, the semiconductor LSI circuit including scan circuits has basically the same structure as the first embodiment. The clock tree structure is the same as that in FIG. 5. In the semiconductor LSI circuit including scan circuits according to the third embodiment, the groups of memory devices, which are controlled by the same root driver or other drivers, are disposed to form two segments, which form the respective scan paths. For example, the group of scan elements 51 in FIG. 5 is disposed to form the segments SG15 and SG17 in FIG. 10.

Figure 11A:
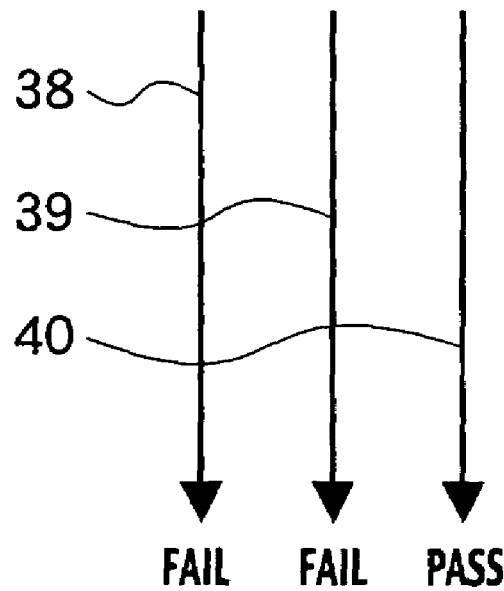
FIG. 11A is a schematic diagram of scanning test paths for the semiconductor LSI circuit with the scan circuits according to the third embodiment of the present invention when a shifting test is carried out several times, and describes a scanning test 1.
Figure 11B:
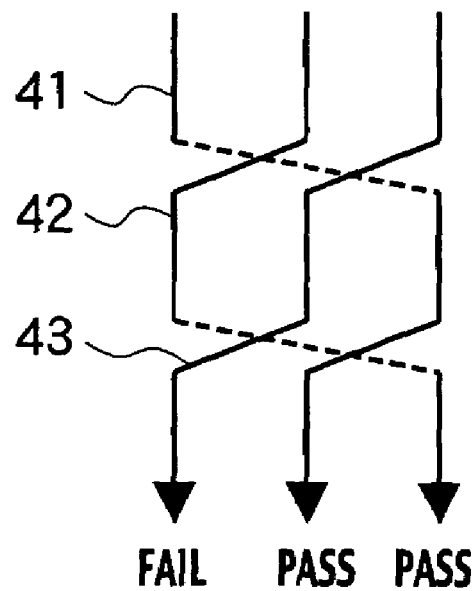
FIG. 11B is a schematic diagram of scanning test paths for the semiconductor LSI circuit with the scan circuits according to the third embodiment of the present invention when a shifting test is carried out several times, and describes a scanning test 2.

Usage of the circuit in FIG. 10 which forms the semiconductor LSI circuit including scan circuits, according to the third embodiment, and implementation of two scanning tests, i.e., the scanning test 1 and the scanning test 2 as shown in FIGS. 11A and 11B narrows down the failure analysis targets to the scan segments SG15 and SG17.

In other words, the results 'fail', 'fail', and 'pass' are obtained for the scan paths 38 to 40, respectively, through the scanning test 1 in FIG. 11A; and the results 'pass', 'pass', and 'fail' are obtained for the scan paths 41 to 43, respectively, through the scanning test 2 in FIG. 11B. Accordingly, narrowing down the failure analysis targets to the scan segments SG15 and SG17 using a combination of the results in FIGS. 11A and 11B is possible.

Figure 11C:
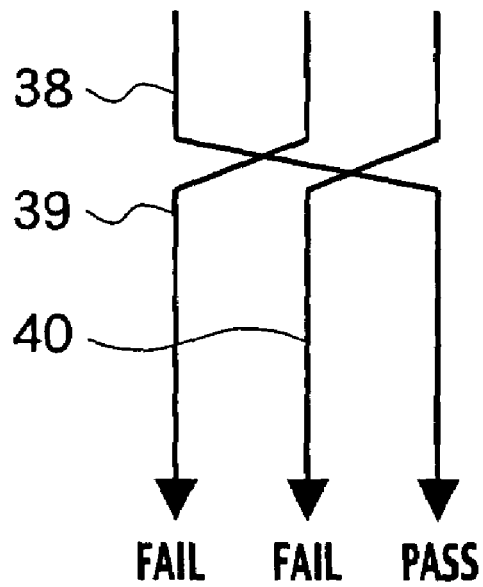
FIG. 11C is a schematic diagram of scanning test paths for the semiconductor LSI circuit with the scan circuits according to the third embodiment of the present invention when a shifting test is carried out several times, and describes a scanning test 3.
Figure 11D:
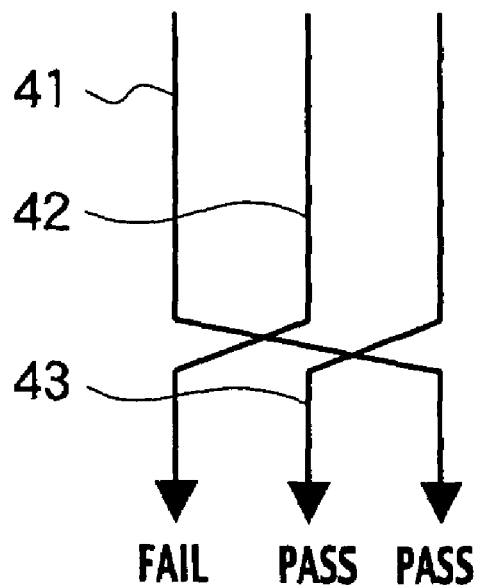
FIG. 11D is a schematic diagram of scanning test paths for the semiconductor LSI circuit with the scan circuits according to the third embodiment of the present invention when a shifting test is carried out several times, and describes a scanning test 4.

Alternatively, the failure analysis targets can also be narrowed down to the scan segments SG15 and SG17 by carrying out the scanning test twice, i.e., the scanning test 3 and the scanning test 4 as shown in FIGS. 11C and 11D.

In other words, the results 'pass', 'fail', and 'fail' are obtained for the scan paths 38 to 40, respectively, through the scanning test 3 in FIG. 11C; and the results 'pass', 'fail', and 'pass' are obtained for the scan paths 41 to 43, respectively, through the scanning test 4 in FIG. 11D. Accordingly, narrowing down the failure analysis targets to the scan segments SG15 and SG17 using a combination of the results in FIGS. 11C and 11D is possible.

With the configuration of the semiconductor LSI circuit including scan circuits according to the third embodiment of the present invention, a failure in a shift path and a failure in a clock driver can be identified by forming scan path segments for each clock driver, and disposing a clock tree of buffers in two scan path segments SG separately.

(A Modified Example of the Third Embodiment)

Figure 12:
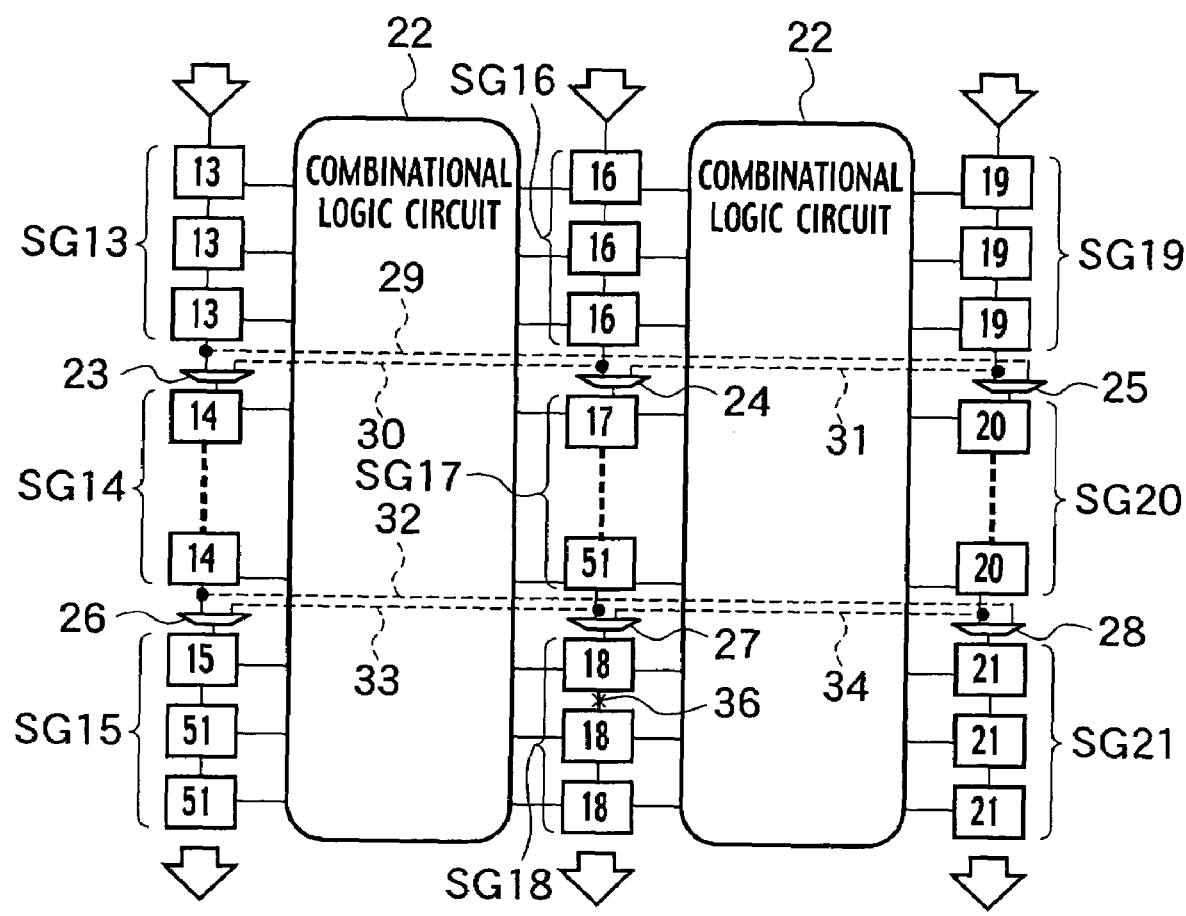
FIG. 12 is a schematic connection diagram of a semiconductor LSI circuit with scan circuits according to a modified example of the third embodiment of the present invention, and is also a schematic diagram of the case where each group of memory elements being controlled by an element at the end of the clock tree forms a plurality of segments.

A semiconductor LSI circuit including scan circuits according to a modified example of the third embodiment of the present invention is described using FIG. 12. As shown in FIG. 12, the semiconductor LSI circuit including scan circuits has basically the same structure as the first embodiment. The clock tree structure is the same as that in FIG. 5. In the semiconductor LSI circuit including scan circuits according to the modified example, the groups of memory devices, which are controlled by the same root driver or other drivers, are disposed to form two segments, which form the respective scan paths. For example, the group of scan elements 51 in FIG. 5 is disposed to form part of the segment SG15 and part of the segment SG17 in FIG. 10.

Usage of the circuit in FIG. 12 to form the semiconductor LSI circuit including scan circuits, according to the modified example and implementation of the scanning test twice, i.e. the scanning test 1 and the scanning test 2 as shown in FIGS. 11A and 11B narrows down failure analysis targets to the scan segments SG15 and SG17.

Alternatively, the failure analysis targets can be narrowed down to the scan segments SG15 and SG17 by carrying out the scanning test twice, i.e., the scanning test 3 and the scanning test 4 as shown in FIGS. 11C and 11D.

With the configuration of the semiconductor LSI circuit including scan circuits according to the modified example, a failure in a shift path and a failure in a clock driver can be identified by forming scan path segments for each clock driver, and disposing a clock tree of buffers in two scan path segments SG separately.

Fourth Embodiment

In a semiconductor LSI circuit including scan circuits according to a fourth embodiment of the present invention, the groups of memory devices, which are controlled by the same root driver or other drivers, are disposed to form a single segment SG, which forms a scan path. For example, the groups of scan elements 48, 49, 50, and 51 in FIG. 13 are disposed to form the segments SG19, SG21, SG17, and SG15 in FIG. 14, respectively.

Figure 14:
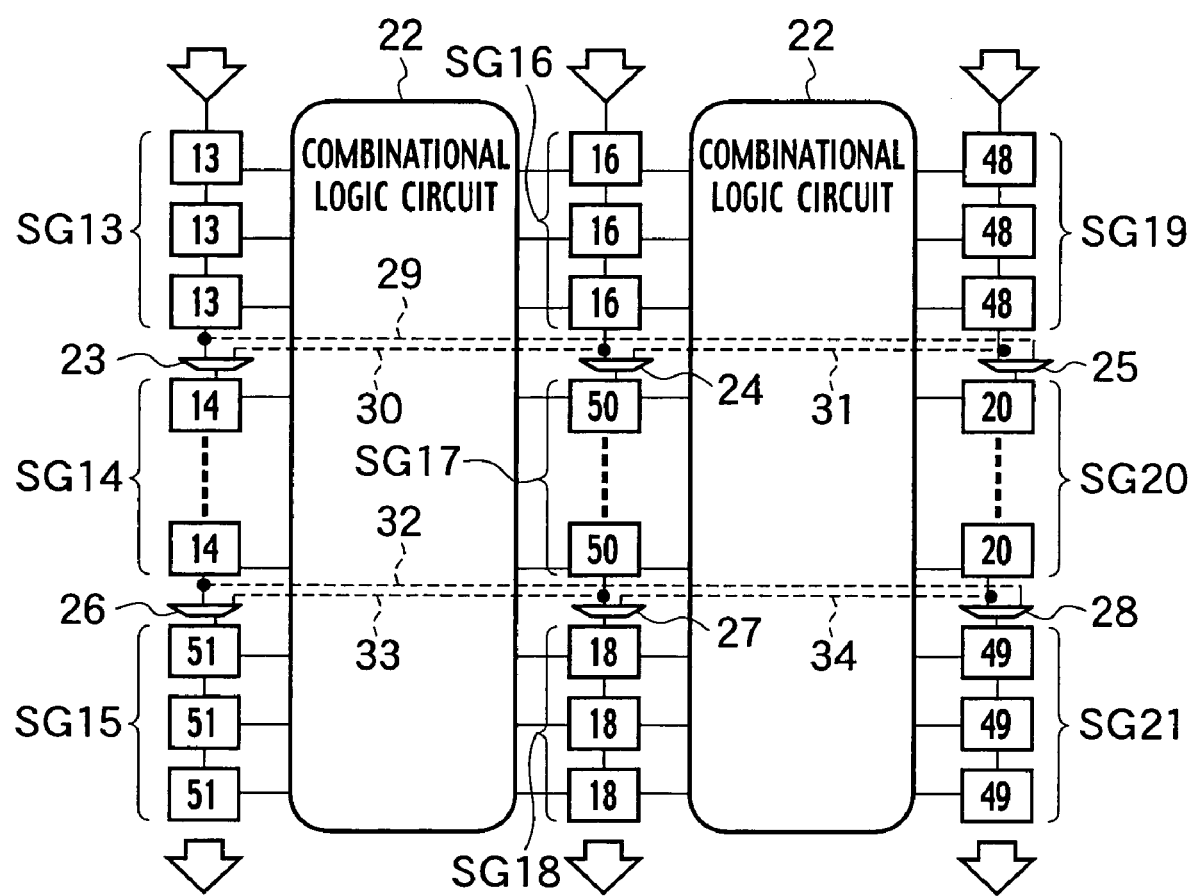
FIG. 14 is a schematic connection diagram of a semiconductor LSI circuit with scan circuits according to a fourth embodiment of the present invention, and is a schematic diagram of the case where each group of memory elements being controlled by an element at the end of the clock tree forms a plurality of segments and is disposed so as to be included in a single scan path.

As shown in FIG. 13, when an upper sub-driver 45 in the tree has a fault 55, a failure in a root driver or an upper sub-driver in the tree can be found by including a path, which includes an upper sub-driver in the clock tree, in the single scan path 43 as shown in FIG. 11B. In the case of FIG. 14, the failure analysis targets can be narrowed down to the scan segments SG15 and SG17 by carrying out the scanning tests 1 and 2 shown in FIGS. 11A and 11B.

With the configuration of the semiconductor LSI circuit including scan circuits according to the fourth embodiment of the present invention, a failure in a root driver or an upper sub-driver in a clock tree can be easily found by forming scan path segments for each clock driver and selecting the scan path for the scanning test such that a path including the root driver or an upper sub-driver in the clock tree can be included in a single path.

Fifth Embodiment

Figure 15:
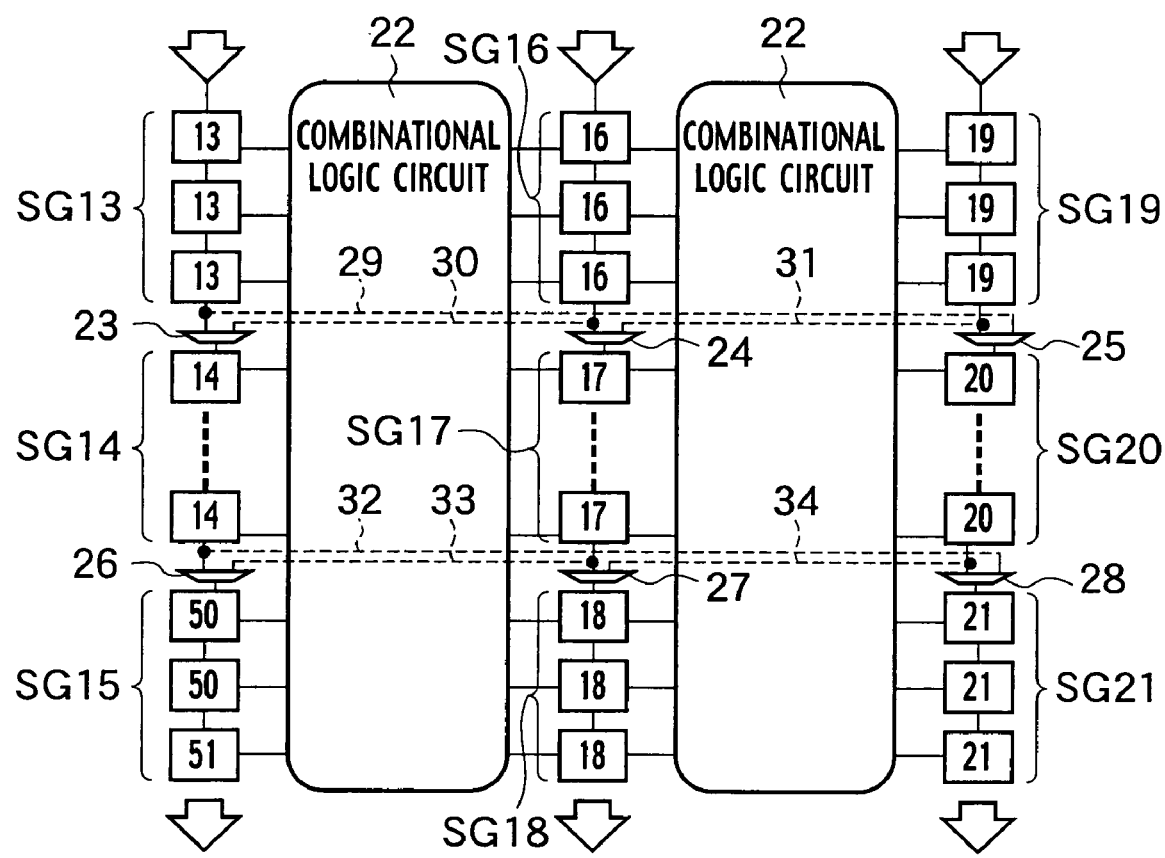
FIG. 15 is a schematic connection diagram of a semiconductor LSI circuit with scan circuits according to a fifth embodiment of the present invention, and is a schematic diagram of the case where each group of memory elements being controlled by an element at the end of the clock tree is disposed so as to be included in a single segment.

A semiconductor LSI circuit including scan circuits according to a fifth embodiment of the present invention is described using FIG. 15. As shown in FIG. 15, the semiconductor LSI circuit including scan circuits has basically the same structure as the first embodiment. The clock tree structure is the same as that in FIG. 13. The groups of scan elements 48 to 51 are controlled by the respective clock drivers. In the fifth embodiment, groups of memory elements controlled by an upper clock driver are disposed to form a single segment, which forms a scan path. For example, the groups of memory elements 50 and 51 in FIG. 13 are disposed to form the segment SG15 in FIG. 15. As shown in FIG. 13, if the sub-driver 45 has the fault 55, identifying a failure using the prior art is difficult. In particular, if scan paths are formed without regard to the clock-tree structure, and if the clock root driver or a sub-driver has a failure, failures may develop in numerous scan paths, which makes identification of a failure portion difficult.

Usage of the circuit in FIG. 15, which is the semiconductor LSI circuit including scan circuits according to the fifth embodiment, and implementation of two scanning and shifting test as shown in FIGS. 4A and 4B narrows down failure analysis targets to the scan segment SG15 to which the groups of scan elements 50 and 51 are serially connected.

Sixth Embodiment

Figure 16:
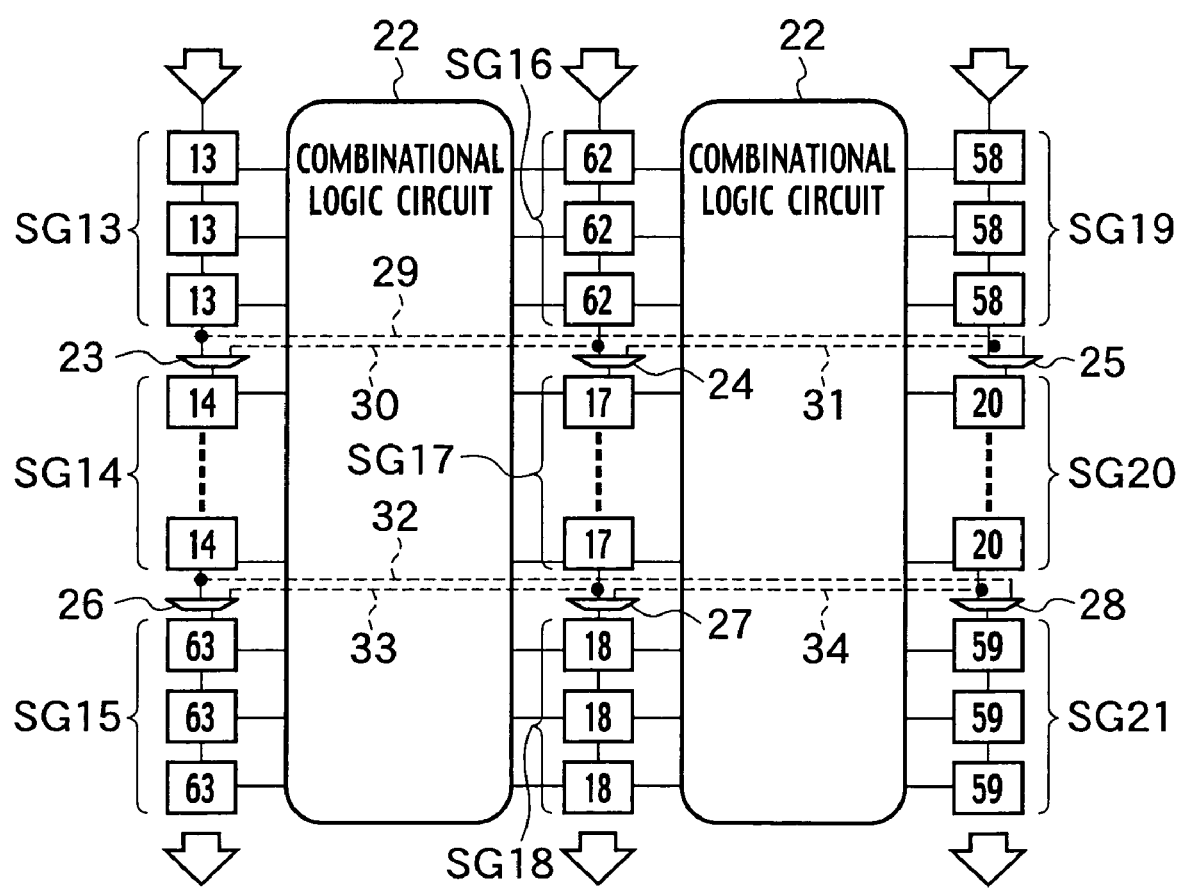
FIG. 16 is a schematic connection diagram of a semiconductor LSI circuit with scan circuits according to a sixth embodiment of the present invention.
Figure 17:
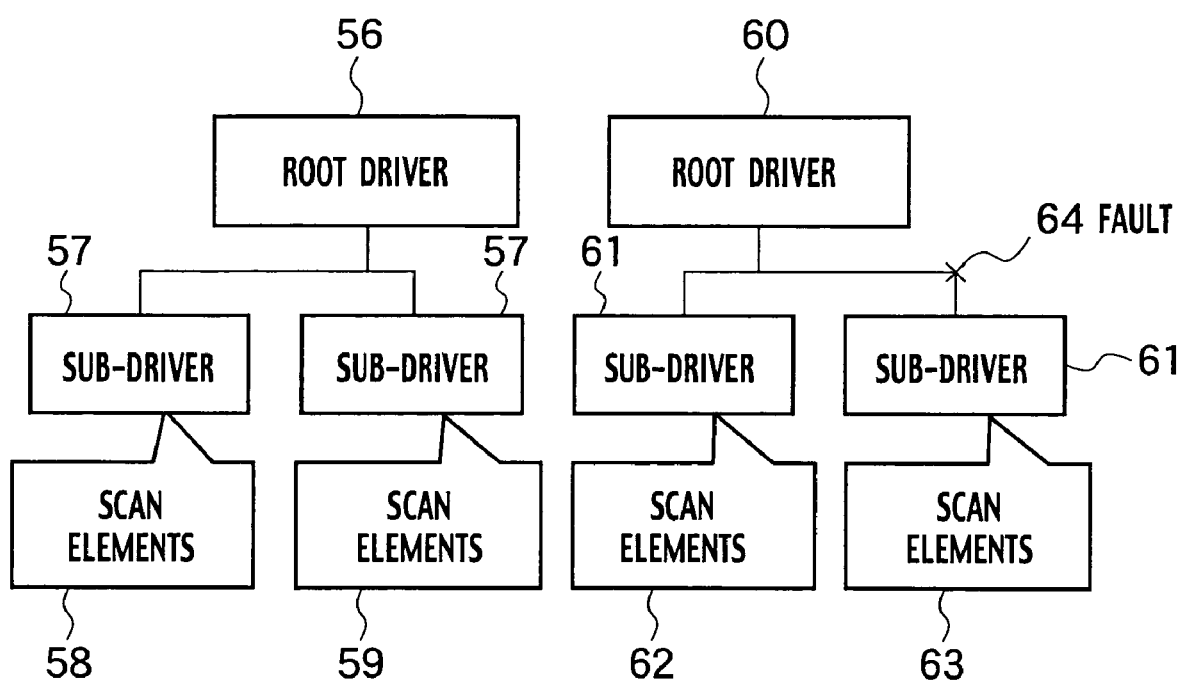
FIG. 17 is a schematic diagram of a tree structure relevant to a set and a reset signal.

FIG. 16 shows the configuration of a semiconductor LSI circuit including scan circuits according to the sixth embodiment of the present invention; and FIG. 17 shows an outline of a set and a reset tree structure. The semiconductor LSI circuit including scan circuits has the same structure as the first embodiment. As shown in FIG. 17, the set tree structure is made up of two sub-drivers 57, which branch off from the root driver 56; and the reset tree structure is made up of two sub-drivers 61, which branch off from the root driver 60. The groups of scan elements 58 and 59 are controlled by the respective sub-drivers 57, and the groups of scan elements 62 and 63 are controlled by the respective sub-drivers 61. In this case, the groups of scan elements 58 and 59 are controlled by the set signal, and form a tree structure of buffers or the like. On the other hand, the groups of scan elements 62 and 63 are controlled by the reset signal, and form a tree structure of buffers or the like.

In the semiconductor LSI circuit including scan circuits according to the sixth embodiment, the groups of scan elements, which are controlled by the same set or reset root driver or other drivers, are disposed to form a single segment, which forms a scan path. For example, the groups of scan elements 58, 59, 62, and 63 in FIG. 17 are disposed to form the segments SG19 SG21, SG16, and SG15 in FIG. 16, respectively.

When a set or reset sub-driver 61 in FIG. 17 has a fault 64, identifying a failure is difficult. In particular, if scan paths are formed without regard to the clock-tree structure, and if the set or reset root driver or a sub-driver has a failure, failures may develop in numerous scan paths, which makes identification of a failure portion difficult.

Usage of the semiconductor LSI circuit including scan circuits according to the sixth embodiment and implementation of two scanning and shifting test as shown in FIGS. 18A and 18B narrows down failure analysis targets to the scan segment SG15.

In other words, the results 'fail', 'pass', and 'pass' are obtained for the scan paths 38 to 40, respectively, through the scanning test 1 in FIG. 18A; and the results 'pass', 'pass', and 'fail' are obtained for the scan paths 41 to 43, respectively, through the scanning test 2 in FIG. 18B. Accordingly, the failure analysis target can be narrowed down to the scan segment SG15 using a combination of the results in FIGS. 18A and 18B.

The semiconductor LSI circuit including scan circuits according to the sixth embodiment of the present invention allows easy identification of a failure portion of a driver when being set or a reset. In addition, employment of the same configuration of the scan circuit as that described in the second embodiment further narrows down failure scan segment targets.

Seventh Embodiment

Figure 19:
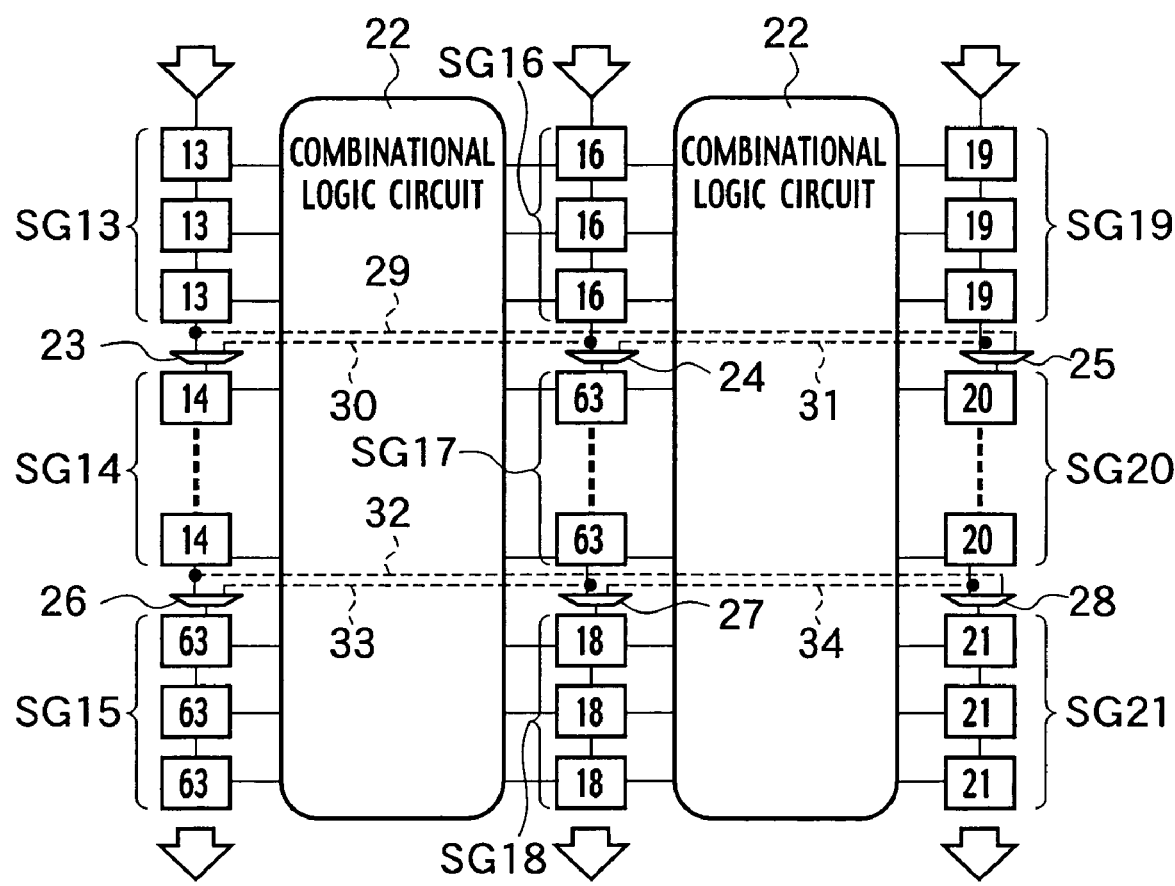
FIG. 19 is a schematic connection diagram of a semiconductor LSI circuit with scan circuits according to a seventh embodiment of the present invention.

FIG. 19 shows a semiconductor LSI circuit including scan circuits according to a seventh embodiment of the present invention. The semiconductor LSI circuit including scan circuits has basically the same structure as the first embodiment. The outline of the set and reset tree structure is the same as that in FIG. 17. In the scan circuit according to the seventh embodiment, the groups of memory elements controlled by the same set or reset root driver or other drivers are disposed to form a plurality of segments, which form the respective scan paths. For example, the group of scan elements 63 in FIG. 17 is disposed to form the segments SG15 and SG17 in FIG. 19.

When the set or reset sub-driver 61 in FIG. 17 has a fault 64, usage of the circuit in FIG. 19, which is the semiconductor LSI circuit including scan circuits according to the seventh embodiment, and implementation of two scanning and shifting test as shown in FIGS. 1A and 11B narrows down failure analysis targets to the scan segments SG15 and SG17.

The semiconductor LSI circuit including scan circuits according to the seventh embodiment allows easy identification of a failure portion when a driver is being set or a reset. In addition, employment of the same configuration of the scan circuit as that described in the second embodiment allows fewer failure scan segment targets for failure analysis.

[Scan Circuit System]

(Clock Tree Synthesis)

Figure 20:
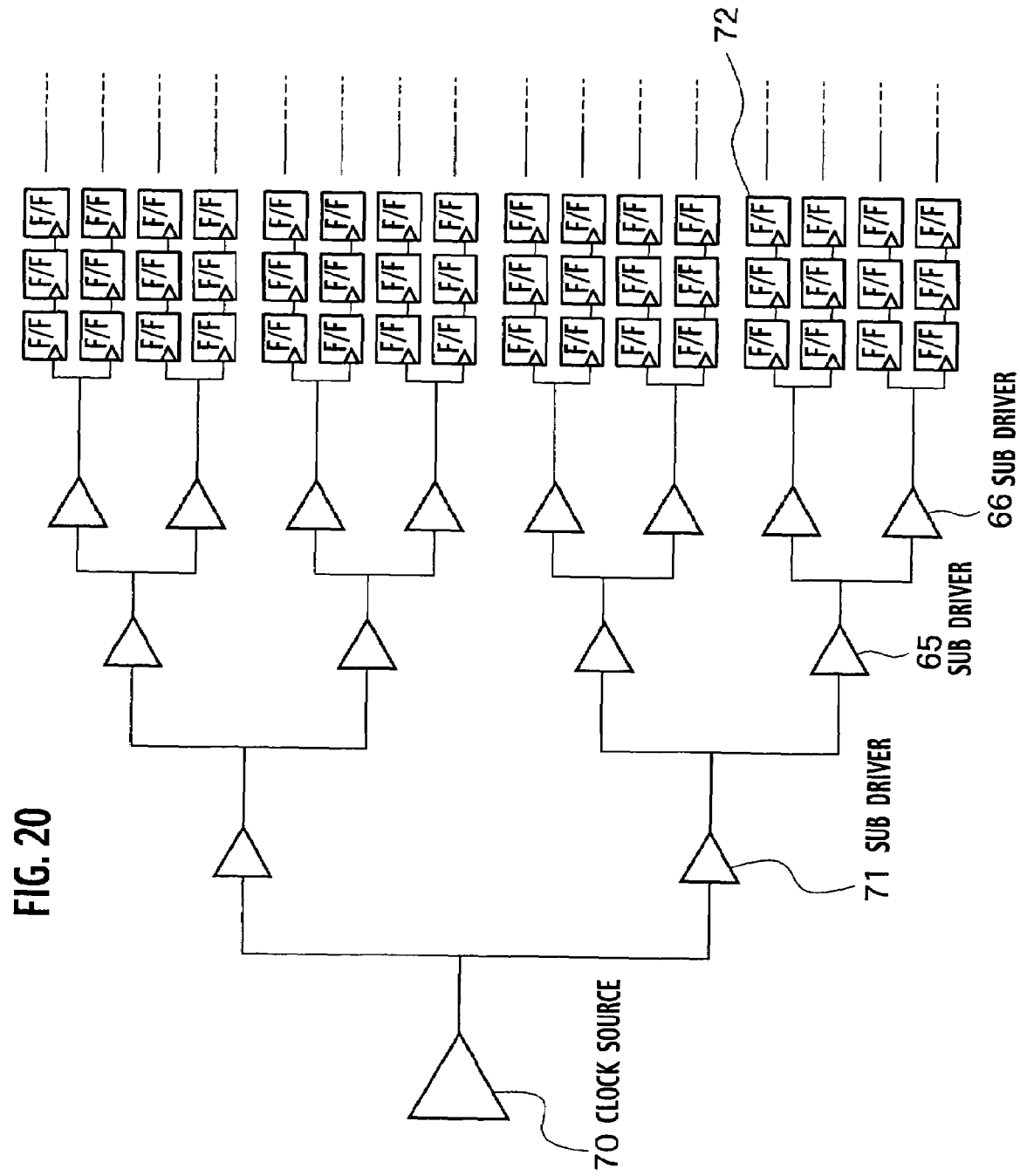
FIG. 20 is a diagram of a clock connection structure made through clock tree synthesis.

An example of a clock tree constructed by a clock-tree synthesis includes two sub-drivers 71, connected to a clock signal source 70, two stages of groups of sub-drivers 66 and 65 connected to the sub-drivers 71 in a tree structure, and a plurality of stages of D-type F/Fs 72 connected to the last stage of sub-drivers 66 in series and also in parallel as shown in FIG. 20.

(Specific Circuit Configuration of a Scan Circuit System)

Figure 21:
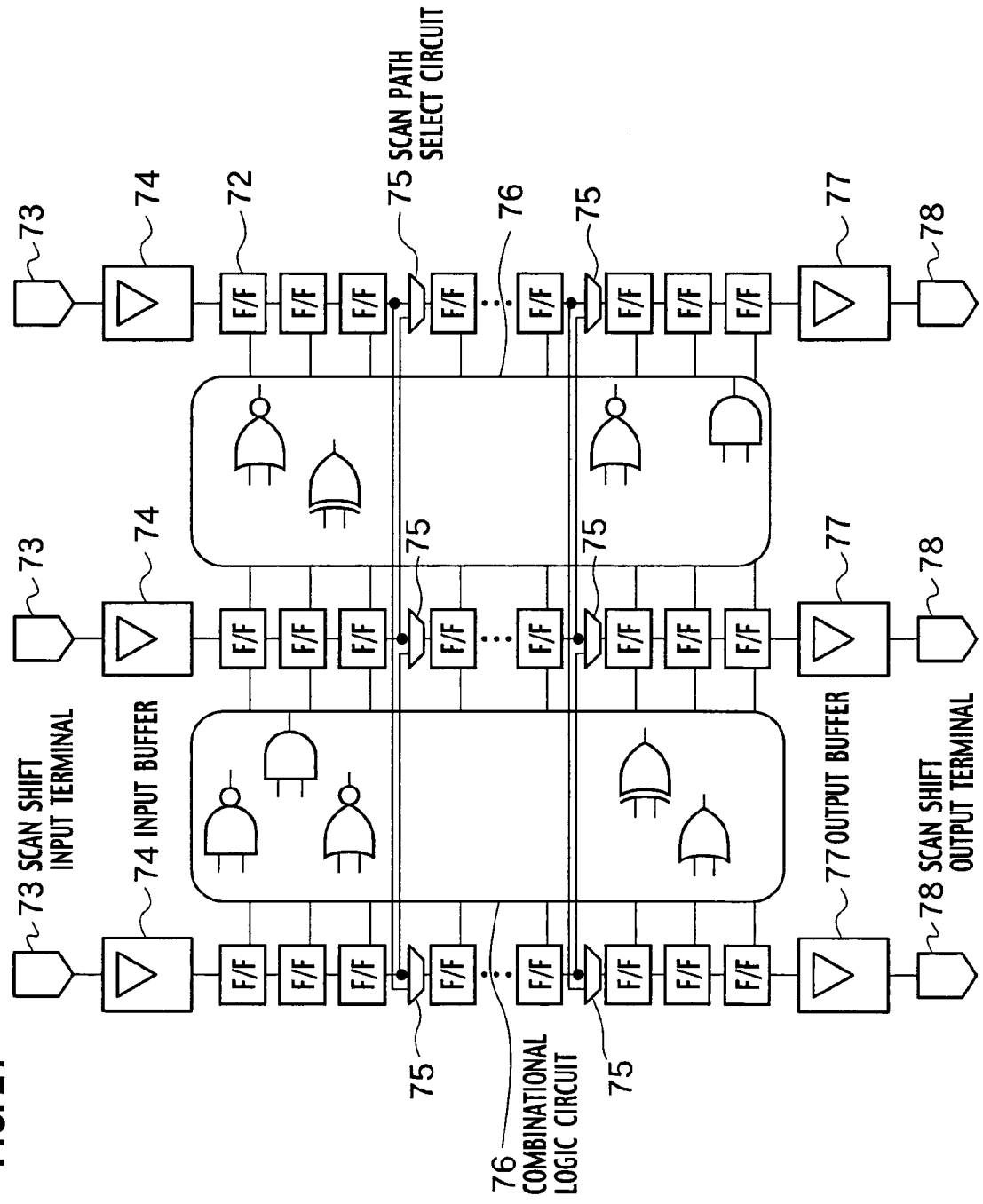
FIG. 21 is a specific circuit diagram of a scan circuit system according to the embodiments of the present invention.

As shown in FIG. 21, the specific circuit configuration of a scan circuit system, according to the embodiments of the present invention, includes D-type F/Fs 72, scan shift input terminals 73, input buffers 74, scan path select circuits 75, combinational logic circuits 76, output buffers 77, and scan shift output terminals 78. The specific circuit configuration of a scan circuit system shown in FIG. 21 is substantially the same as the semiconductor LSI circuit including scan circuits according to the first embodiment of the present invention. Note that allocation of the scan shift input terminals 73, the input buffers 74, the output buffers 77, and the scan shift output terminals 78 is clarified in order to show that the scan circuit system can be expanded. In addition, since various complex logic circuits are actually disposed in the combinational logic circuits 76, those combinational logic circuits 76 are schematically represented by a buffer, an inverter, AND gates, NAND gates, NOR gates, OR gates, or exclusive OR gates. Moreover, it is apparent that a circuit equivalent to the selectors 23 to 28 shown in FIG. 1 or the selectors shown in FIG. 2 can be used as the scan path select circuit 75.

(Operating Method)

(During Normal Operation)

Figure 22:
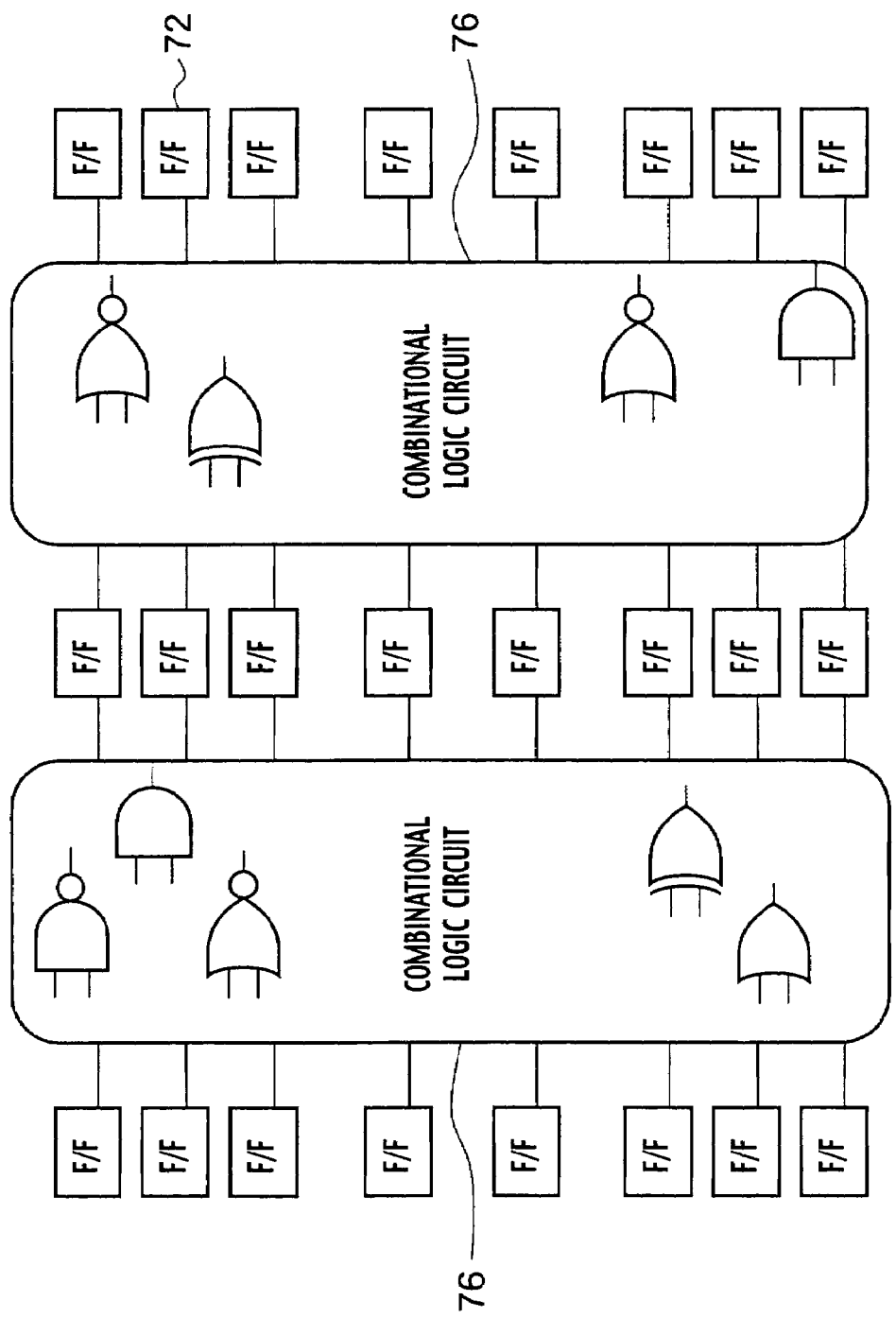
FIG. 22 is a basic circuit diagram of the scan circuit system according to the embodiments of the present invention during normal operation.

As shown in FIG. 22, the basic circuit configuration of the scan circuit system during normal operation includes D-type F/Fs 72 and two combinational logic circuits 76. In other words, during normal operation, the scanning test is not carried out; however, normal operation of the semiconductor LSI circuit is carried out in the two combinational logic circuits 76. The D-type F/Fs 72 are not connected in series along the scan path, and the scan path select circuits 75 are not in an operating state.

(During Scan and Shift Operation)

Figure 23:
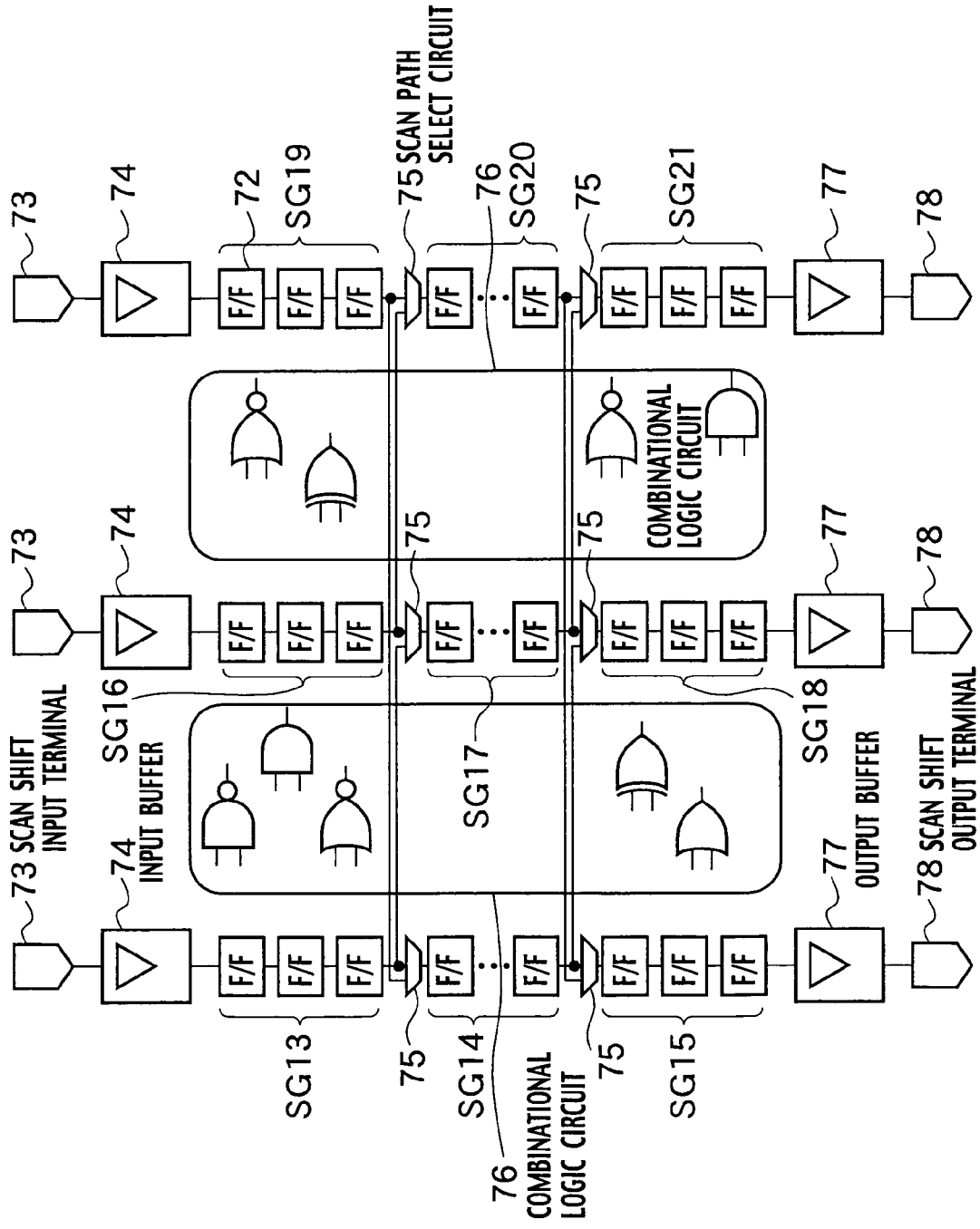
FIG. 23 is a basic circuit diagram of the scan circuit system according to the embodiments of the present invention during a scan and shift operation.

As shown in FIG. 23, the basic circuit configuration of the scan circuit system during scan and shift operation includes the D-type F/Fs 72, the scan shift input terminals 73, the input buffers 74, the scan path select circuits 75, the combinational logic circuits 76, the output buffers 77, and the scan shift output terminals 78. The groups of scan elements are disposed to form the scan segments SG13 to SG21, respectively. As with the method described in the first through the seventh embodiment of the semiconductor LSI circuit including scan circuits, a failure in a clock found through the shifting test can be easily narrowed down by forming scan path segments for each clock root driver.

(Exemplary Configuration of Reset/Set Tree)

Figure 24:
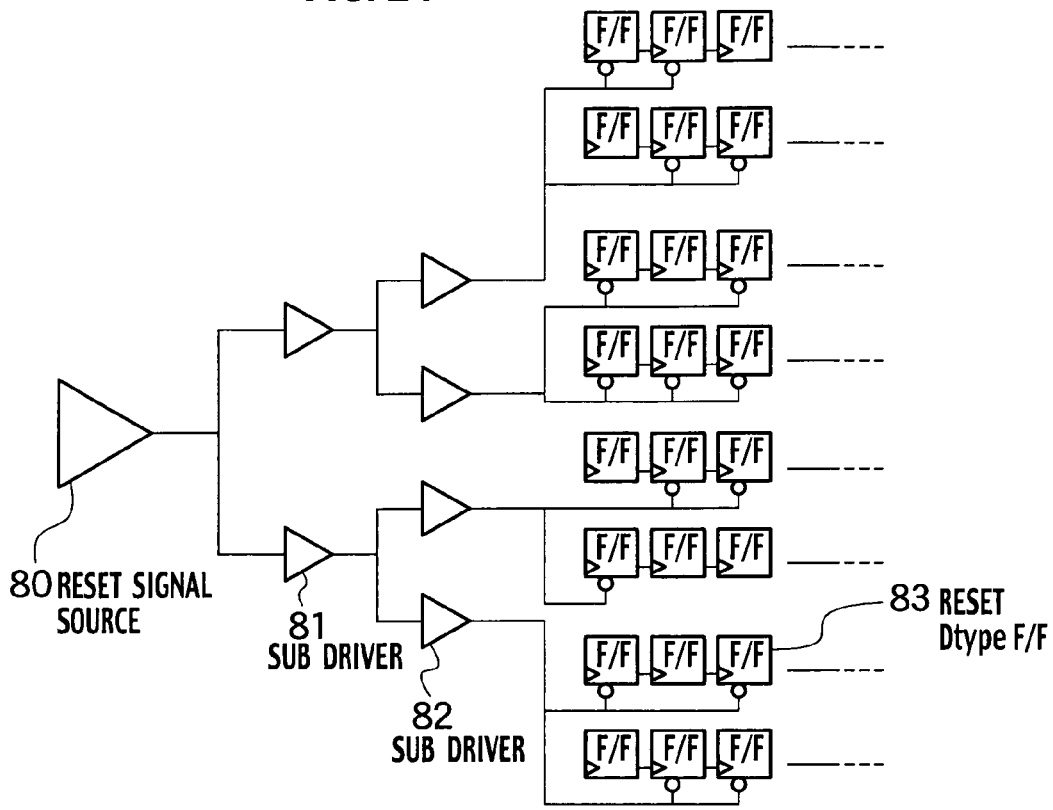
FIG. 24 is a schematic diagram of a reset tree.

The reset tree includes a reset signal source 80, sub-drivers 81 connected to the reset signal source 80, sub-drivers 82 connected to the sub-drivers 81, and a plurality of D-type reset F/Fs 83 connected to the sub-drivers 82 in series and also in parallel as shown in FIG. 24. The reset tree shown in FIG. 24 is an expanded example of the reset tree configuration shown in FIG. 17. Application of the reset tree to the scan circuit system shown in FIG. 21 or FIG. 23 allows easy identification of a failure portion of the reset tree.

Figure 25:
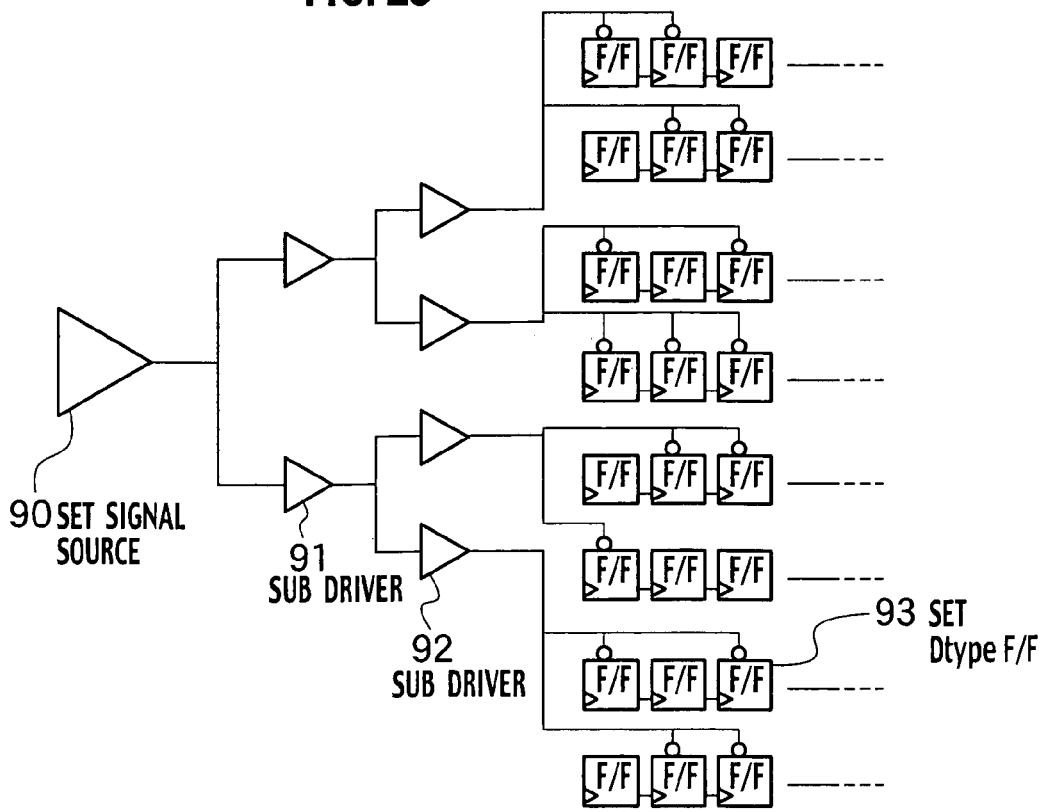
FIG. 25 is a schematic diagram of a set tree.

The set tree includes a set signal source 90, sub-drivers 91 connected to the set signal source 90, sub-drivers 92 connected to the sub-drivers 91, and a plurality of D-type set F/Fs 93 which are connected to the sub-drivers 92 in series and also in parallel as shown in FIG. 25. The set tree shown in FIG. 25 is an expanded example of the set tree configuration shown in FIG. 17. Application of the set tree to the scan circuit system shown in FIG. 21 or FIG. 23 allows easy identification of a failure portion of the set tree.

(Relationship between Scan Circuit System and Clock Tree)

Figure 26:
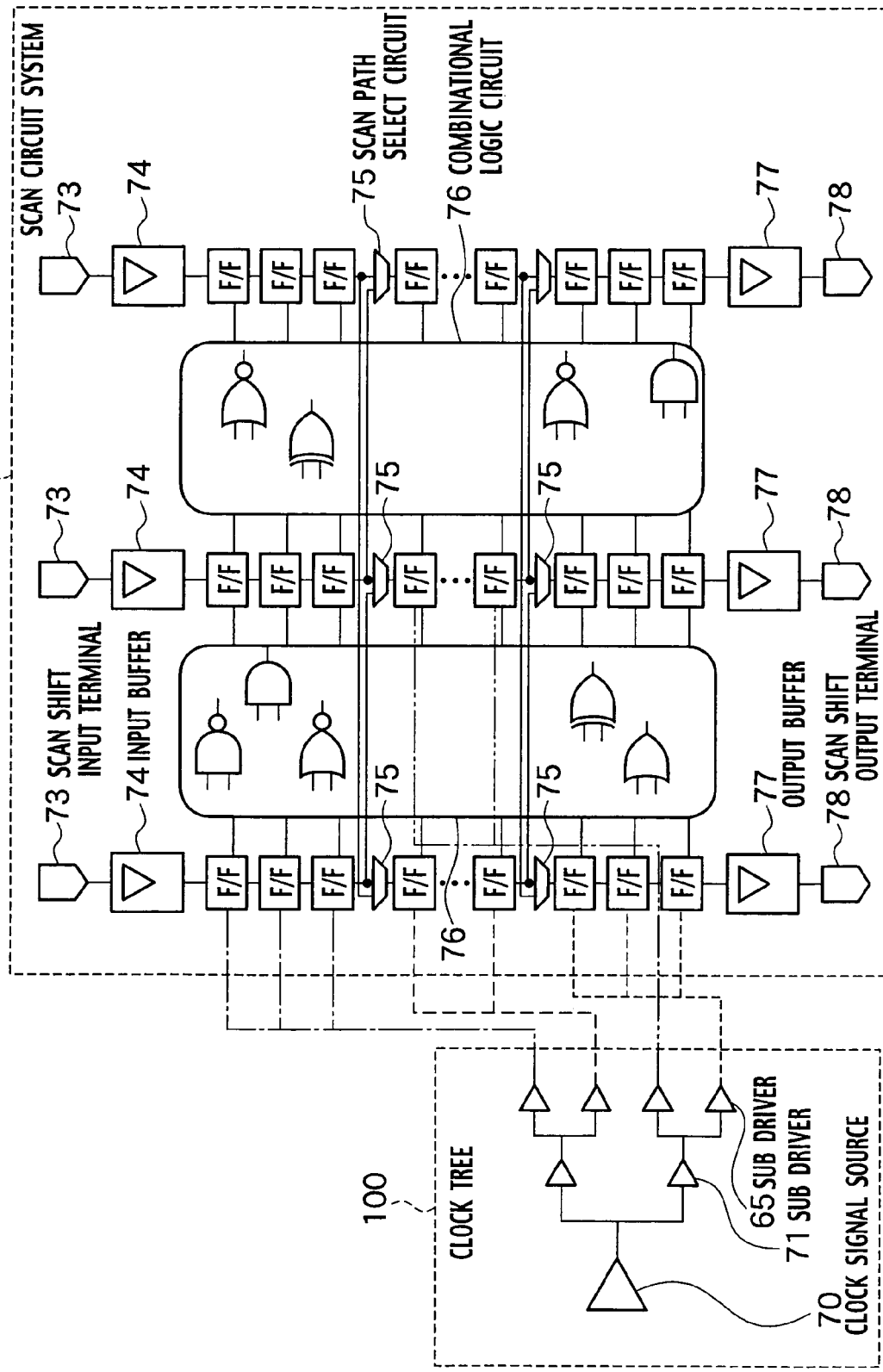
FIG. 26 is an entire block diagram of a scan circuit system and a clock tree according to the embodiments of the present invention.

As shown in FIG. 26, the entire configuration of the scan circuit system according to the embodiments of the present invention includes a clock tree 100 and a scan circuit system 200. The clock tree 100 has the same configuration as that shown in FIG. 20. In addition, the scan circuit system 200 has the same configuration as that shown in FIG. 21. In FIG. 26, the D-type F/Fs 72, which are not connected to the clock tree 100, are controlled by a clock tree system.

[Scanning Test System]

Figure 27:
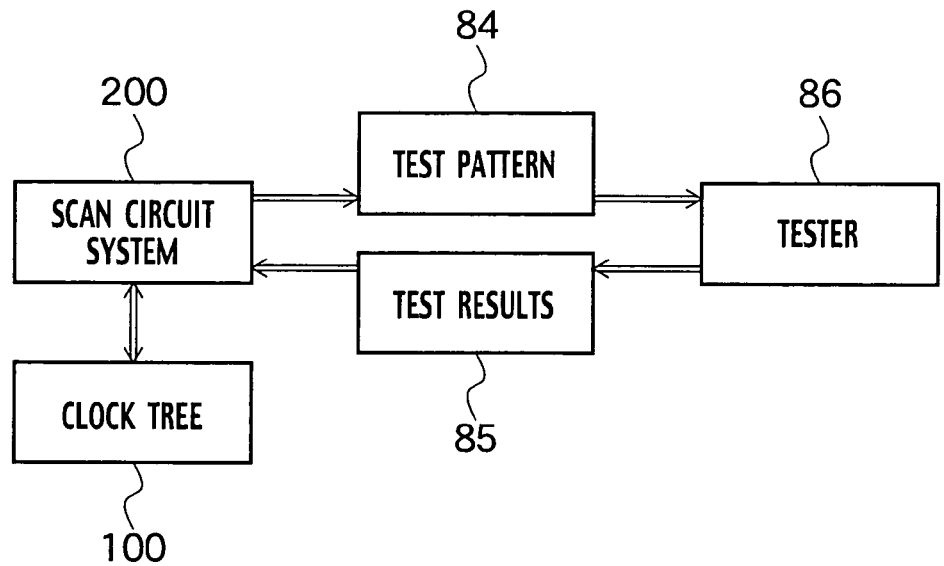
FIG. 27 is a block diagram of a scanning test system according to the embodiments of the present invention.

As shown in FIG. 27, a scanning test system, which uses the test results provided by the scan circuit system according to the embodiments of the present invention and identifies a failure portion, includes a clock tree 100, a scan circuit system 200, a test pattern 84, a tester 86, and test results 85. The scan circuit system 200, which is controlled in conformity with data from the clock tree 100, generates and sends the test pattern 84 to the tester 86. The test pattern 84 is test data for testing an LSI. The tester 86 is a testing circuit system for testing the operating performance of the LSI. The test results 85 data provided by the tester 86 is fed back to the scan circuit system 200, which then identifies a failure portion in an LSI.

[Scanning Test System Method]

(A Failure Analysis Method using a Scanning Test System)

Figure 28:
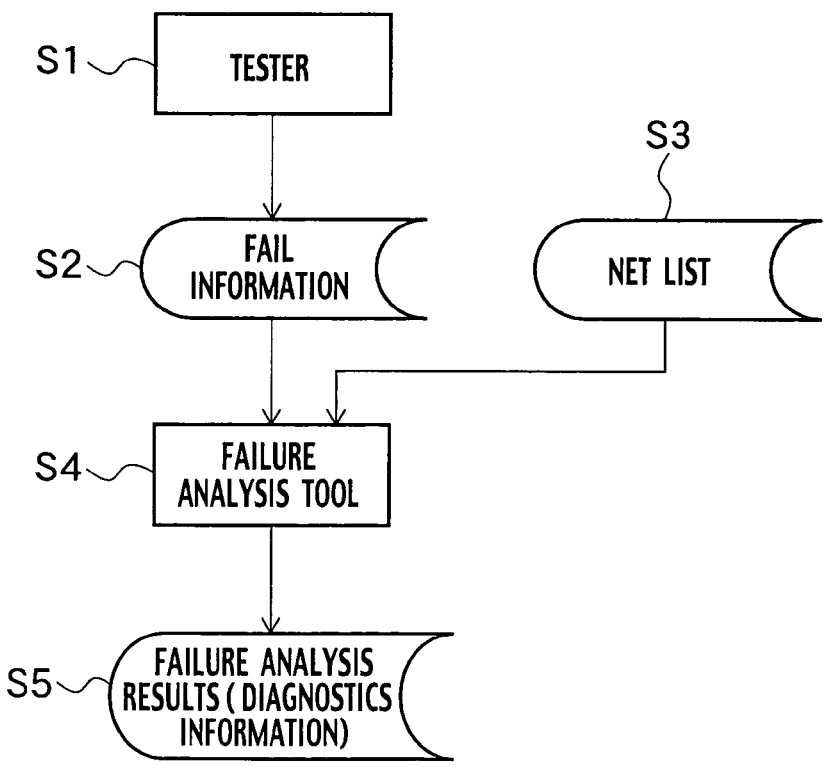
FIG. 28 is a flowchart for failure analysis using a scanning test system according to the embodiments of the present invention.

A failure analysis method using the scanning test system, according to the embodiments of the present invention shown in FIG. 27, is implemented as shown in steps S1 through S5 in the flowchart of FIG. 28.

To begin with, in step S1, an LSI is tested by the tester 86.

Next, in step S2, the tester 86 obtains diagnostics information, which is failure data of the LSI.

In step S3, net list data is obtained.

In step S4, the diagnostics information obtained in step S2 and the net list data obtained in step S3 are compared, and failure analysis is carried out using a failure analysis tool.

In step S5, diagnostics information is detected in conformity with the failure analysis results.

(Automation Tool Flow: Scan Chain Reordering)

Figure 29:
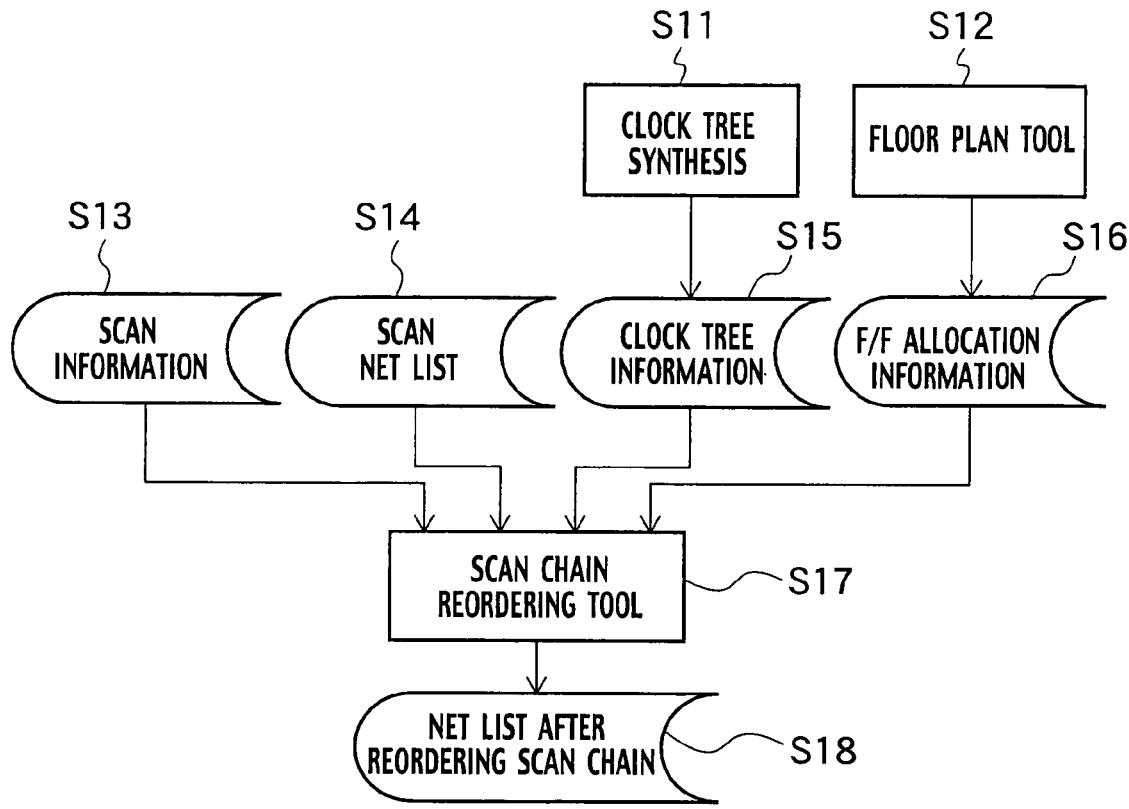
FIG. 29 is a flowchart for an automation tool flow (scan chain reordering) of a scanning test system according to the embodiments of the present invention.

The operation according to an automation tool flow (scan chain reordering), which represents a failure analysis method using the scanning test system according to the embodiments of the present invention shown in FIG. 27, is carried out as shown in steps Sil through S18 in the flowchart of FIG. 29.

In step S11, clock tree synthesis as shown in FIG. 20 is carried out.

Next, in step S12, an LSI floor plan tool is used.

In step S13, scan information is obtained.

In step S14, a scan net list is obtained.

In step S15, clock tree information provided through the clock tree synthesis carried out in step S11 is obtained.

F/F allocation information provided using the LSI allocation/floor plan tool in step S12 is obtained.

In step S17, the scanned information, the scanned net list, the clock tree information, and the F/F allocation information obtained in steps S13 through S16, respectively, are sent to the scan chain reordering tool, and scan chain reordering is carried out.

In step S18, a net list after the scan chain reordering is obtained.

(Automation Tool Flow: Scanning)

Figure 30:
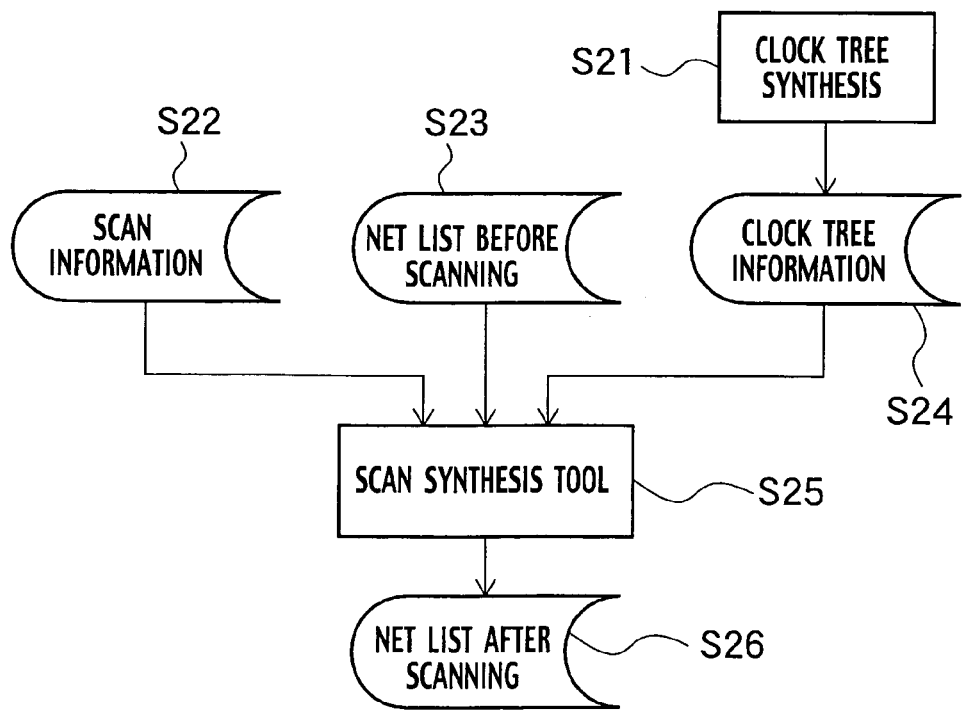
FIG. 30 is a flowchart for an automation tool flow (scanning) of a scanning test system according to the embodiments of the present invention.

The operation of automation tool flow (scanning), which represents the failure analysis method using the scanning test system according to the embodiments of the present invention shown in FIG. 27, is carried out as shown in steps S21 through S26 in the flowchart of FIG. 30.

In step S21, clock tree synthesis as shown in FIG. 20 is carried out.

In step S22, scan information is obtained.

In step S23, a net list before scanning is obtained.

In step S24, clock tree information provided through the clock tree synthesis in step S21 is obtained.

In step S25, the scan information, the net list before scanning, and the clock tree information obtained in steps S22 through S24, respectively, are sent to the scan synthesis tool, and scan chain reordering is then carried out.

In step S26, a net list after scanning is obtained.

The present invention is described according to the embodiments; however, it should not be perceived that the descriptions and drawings forming a part of this disclosure are intended to limit the present invention. Various alternative embodiments, working examples, and operational techniques will become apparent from this disclosure for those skills in the art. Accordingly, the technical range of the present invention is determined only by specified features of the above-mentioned inventive descriptions and appropriate appended claims.

In addition, the embodiments of the present invention can be modified and implemented in various ways as long as not deviating from the summary of the present invention. Note that a combination of the above-discussed embodiments can be implemented. In this manner, the present invention naturally includes various embodiments not described herein.

What is claimed is:

1. A semiconductor LSI circuit provided with a scan circuit comprising:
   a plurality of to-be-tested combinational logic circuits;
   a plurality of scan circuits adjacent to and disposed alternately with the combinational logic circuits; a plurality of scan elements, which form the scan circuits;
   a first selector inserted in a first scan circuit of the plurality of scan circuits and connects a first group of scan elements and a second group of scan elements in the scan circuit;
   a second selector inserted in a second scan circuit of the plurality of scan circuits and connects a third group of scan elements and a fourth group of scan elements in the scan circuit;
   a first route provided in the first group of scan elements and extending from a scanning output terminal of a scan element prior to the first selector to the first selector; and
   a second route provided in a third group of scan elements, and extending from the scanning output terminal of a scan element prior to the second selector to the first selector, wherein the first selector selects either the first route or the second route and the combinational logic circuits include a buffer, an inverter, a NAND gate, an AND gate, a NOR gate, an OR gate, or an exclusive OR gate.

2. The semiconductor LSI circuit provided with a scan circuit of claim 1, wherein the first selector and the second selector comprise multiplexers, which receive segment signals from a plurality of routes, selected in conformity with a control signal, and send the segment signals to a subsequent scan chain.

3. The semiconductor LSI circuit provided with a scan circuit of claim 1, further comprising:
   a clock tree including root drivers, wherein the scan elements controlled by a root driver at an end of the clock tree or an upper root driver therein are disposed as one or more groups of scan elements.

4. The semiconductor LSI circuit provided with a scan circuit of claim 1, further comprising a set tree and a reset tree, wherein the scan elements controllable in conformity with a set or a reset signal are disposed as one or more groups of scan elements.

5. The semiconductor LSI circuit provided with a scan circuit of claim 4, wherein the set tree comprises a set signal source, sub-drivers connected to the set signal source, and D-type set flip-flops, which are connected to the sub-drivers.

6. The semiconductor LSI circuit provided with a scan circuit of claim 4, wherein the reset tree comprises a reset signal source, sub-drivers connected to the reset signal source, and D-type reset flip-flops, which are connected to the sub-drivers.

7. A scan circuit system comprising a semiconductor LSI circuit with a scan circuit, the semiconductor LSI circuit comprising:
   a plurality of to-be-tested combinational logic circuits; a plurality of scan circuits adjacent to and disposed alternately with the combinational logic circuits; a plurality of scan elements, which forms the scan circuits; a first selector inserted in a first scan circuit of the plurality of scan circuits and connecting a first group of scan elements and a second group of scan elements in the scan circuits; a second selector inserted in a second scan circuit of the plurality of scan circuits and connecting a third group of scan elements and a fourth group of scan elements in the scan circuits; a first route provided in the first group of scan elements and extending from a scanning output terminal of a scan element prior to the first selector to the first selector; and a second route provided in the third group of scan elements and extending from the scanning output terminal of a scan element prior to the second selector to the first selector, wherein the first selector selects either the first route or the second route;
   input buffers and output buffers connected to the scan path;
   scan shift input terminals connected to the input buffers; and
   scan shift output terminals connected to a output buffers, wherein the combinational logic circuits include a buffer, an inverter, a NAND gate, an AND gate, a NOR gate, an OR gate, or an exclusive OR gate.

8. The scan circuit system of claim 7, wherein the first selector and the second selector comprise multiplexers, which receive segment signals from a plurality of routes, selected in conformity with a control signal, and send the segment signals to a subsequent scan chain.

9. The scan circuit system of claim 7, wherein, the semiconductor LSI circuit with a scan circuit further comprises:
   a clock tree including root drivers, wherein, the scan elements controlled by a root driver at an end of the clock tree or an upper root driver therein, are disposed as one or more groups of scan elements.

10. The scan circuit system of claim 7, wherein, the semiconductor LSI circuit with a scan circuit further comprises a set tree and a reset tree, wherein a scan element controllable in conformity with a set or a reset signal is disposed as one or more groups of scan elements.

11. The scan circuit system of claim 10, wherein the set tree further comprises:

a set signal source;
sub-drivers connected to the set signal source; and
D-type set flip-flops connected to the sub-drivers.

12. The scan circuit system of claim 10, wherein the reset tree further comprises:
a reset signal source;
sub-drivers connected to the reset signal source; and
D-type reset flip-flops connected to the sub-drivers.

13. A scanning test system comprising:
a scan circuit system including:
  a semiconductor LSI circuit with a scan circuit, which includes a plurality of to-be-tested combinational logic circuits; a plurality of scan circuits adjacent to and disposed alternately with the combinational logic circuits; a plurality of scan elements forming the scan circuits; a first selector inserted in a first scan circuit of the plurality of scan circuits and connecting a first group of scan elements and a second group of scan elements in a scan circuits; a second selector inserted in a second scan circuit of the plurality of scan circuits and connecting a third group of scan elements and a fourth group of scan elements in the scan circuits, a first route disposed in the first group of scan elements and extending from a scanning output terminal of a scan element prior to the first selector to the first selector; and a second route disposed in the third group of scan elements and extending from the scanning output terminal of a scan element prior to the second selector to the first selector; wherein the first selector selects either the first route or the second route;
input buffers and output buffers connected to the scan path;
scan shift input terminals connected to the input buffers; and
scan shift output terminals connected to the output buffers, a tester receives a test pattern generated from the scan circuit system and feeds back the test results to the scan circuit system; and a clock tree, which includes root drivers connected to the scan circuit system, wherein the combinational logic circuits include a buffer, an inverter, a NAND gate, an AND gate, a NOR gate, an OR gate, or an exclusive OR gate.

14. The scanning test system of claim 13, wherein the first selector and the second selector comprise multiplexers, which receive segment signals from a plurality of routes, selected in conformity with a control signal, and send the segment signals to a subsequent scan chain.

15. The scanning test system of claim 13, wherein the semiconductor LSI circuit provided with a scan circuit further comprises a clock free including root drivers, wherein the scan elements controlled by a root driver at the end of the clock tree or an upper driver therein are disposed as one or more groups of scan elements.

16. The scan circuit system of claim 13, wherein the semiconductor LSI circuit with a scan circuit further comprises a set tree and a reset tree, wherein a scan element controllable in conformity with a set or a reset signal, is disposed as one or more groups of scan elements.

17. The scan circuit system of claim 16, wherein the set tree further comprises:
a set signal source;
sub-drivers connected to the set signal source; and
D-type set flip-flops connected to the sub-drivers.

18. The scan circuit system of claim 16, wherein the reset tree further comprises:
a reset signal source;
sub-drivers connected to the reset signal source; and
D-type reset flip-flops connected to the sub-drivers.

* * * * *